US006721938B2

(12) United States Patent
Pierrat et al.

(10) Patent No.: US 6,721,938 B2
(45) Date of Patent: Apr. 13, 2004

(54) OPTICAL PROXIMITY CORRECTION FOR PHASE SHIFTING PHOTOLITHOGRAPHIC MASKS

(75) Inventors: Christophe Pierrat, Santa Clara, CA (US); Michel Luc Côté, San Jose, CA (US)

(73) Assignee: Numerical Technologies, Inc., San Jose, CA (US)

( * ) Notice: Subject to any disclaimer, the term of this patent is extended or adjusted under 35 U.S.C. 154(b) by 213 days.

(21) Appl. No.: 10/082,697

(22) Filed: Feb. 25, 2002

(65) Prior Publication Data

US 2002/0188924 A1 Dec. 12, 2002

Related U.S. Application Data

(60) Provisional application No. 60/296,788, filed on Jun. 8, 2001, provisional application No. 60/304,142, filed on Jul. 10, 2001, and provisional application No. 60/325,689, filed on Sep. 28, 2001.

(51) Int. Cl.[7] .............................. G06F 17/50; G03F 9/00; G03F 7/20; G03C 5/00
(52) U.S. Cl. ................................ 716/19; 716/21; 716/8; 430/5; 430/394
(58) Field of Search .......................... 716/19, 21, 1–18; 430/5, 394

(56) References Cited

U.S. PATENT DOCUMENTS

| 5,302,477 | A | 4/1994 | Dao et al. ........................ 430/5 |
| 5,308,741 | A | 5/1994 | Kemp ........................... 430/312 |
| 5,324,600 | A | 6/1994 | Jinbo et al. ...................... 430/5 |

(List continued on next page.)

FOREIGN PATENT DOCUMENTS

| DE | 195 45 163 A1 | 6/1996 |
| GB | 2333613 | 7/1999 |
| JP | 62067547 | 3/1987 |

(List continued on next page.)

OTHER PUBLICATIONS

Ackmann, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

(List continued on next page.)

*Primary Examiner*—Matthew Smith
*Assistant Examiner*—Magid Dimyan
(74) *Attorney, Agent, or Firm*—Mark A. Haynes; Haynes Beffel & Wolfeld LLP

(57) ABSTRACT

A method for producing a computer readable definition of photolithographic mask used to define a target pattern is provided. The phase shift mask patterns include phase shift windows, and the trim mask patterns include trim shapes, which have boundaries defined by such sets of line segments. For a particular pair of phase shift windows used to define a target feature in a target pattern, each of the phase shift windows in the pair can be considered to have a boundary that includes at least one line segment that abuts the target feature. Likewise, a complementary trim shape used in definition of the target feature, for example by including a transmissive region used to clear an unwanted phase transition between the particular pair of phase shift windows, includes at least one line segment that can be considered to abut the target feature. Proximity correction is provided by adjusting the position of the at least one line segment on the boundary of a phase shift windows in said pair which abuts the target feature, and by adjusting the position of the at least one line segment on the boundary of the complementary trim shape which abuts the target feature.

53 Claims, 22 Drawing Sheets

(6 of 22 Drawing Sheet(s) Filed in Color)

U.S. PATENT DOCUMENTS

| | | | |
|---|---|---|---|
| 5,364,716 A | 11/1994 | Nakagawa et al. | 430/5 |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,958,656 A * | 9/1999 | Nakao | 430/394 |
| 5,994,002 A | 11/1999 | Matsuoka | 430/5 |
| 5,998,068 A | 12/1999 | Matsuoka | 430/5 |
| 6,057,063 A * | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,114,071 A | 9/2000 | Chen et al. | 430/5 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,425,117 B1 * | 7/2002 | Pasch et al. | 716/21 |
| 6,455,205 B1 * | 9/2002 | Cobb et al. | 430/5 |
| 6,541,167 B2 * | 4/2003 | Petersen et al. | 430/5 |
| 6,574,784 B1 * | 6/2003 | Lippincott et al. | 716/8 |
| 6,576,377 B2 * | 6/2003 | Kikuchi | 430/5 |
| 6,611,953 B1 * | 8/2003 | Filseth et al. | 716/19 |
| 6,622,296 B2 * | 9/2003 | Hashimoto et al. | 716/19 |
| 2001/0000240 A1 | 4/2001 | Wang et al. | 430/5 |
| 2001/0028985 A1 | 10/2001 | Wang et al. | 430/5 |
| 2002/0160278 A1 * | 10/2002 | Winder et al. | 430/5 |
| 2003/0027057 A1 * | 2/2003 | Schroeder et al. | 430/5 |
| 2003/0106037 A1 * | 6/2003 | Moniwa et al. | 716/19 |

FOREIGN PATENT DOCUMENTS

| | | |
|---|---|---|
| JP | 2-140743 | 5/1990 |
| JP | 1283925 | 2/1991 |
| JP | 6-67403 | 3/1994 |
| JP | 0 653 679 A2 | 5/1995 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |

OTHER PUBLICATIONS

Matsuoka, K., et al., "Application of Alternating Phase–Shifting Mask to 0.16um CMOS Logic Gate Patterns", Matsushita Electric Ind. Co., Ltd. (9 pages) No date.

Choi, Y., et al., "Optical Proximity Correction on Attenuted Phase Shifting Photo Mask for Dense Contact Array", L.G Semicon Company (11 pages).

Wang, R., et al., "Polarized Phase Shift Mask: Concept, Design, and Potential Advantages to Photolithography Process and Physical Design", Motorola Semiconductor Product Sector (12 pages) No date.

Ogawa, K.. et al., "Phase Defect Inspection by Differential Interference", Lasertec Corporation (12 pages) No date.

Pistor, T., "Rigorous 3D Simulation of Phase Defects in Alternating Phase–Shifting Masks", Panoramic Technology Inc. (13 pages) No date.

Semmier, A., et al., "Application of 3D EMF Simulation for Development and Optimization of Alternating Phase Shifting Masks", Infineon Technologies AG (12 pages) No date.

Wong, A., et al., "Polarization Effects in Mask Transmission", University of California Berkeley (8 pages) No date.

Erdmann, A., "Topography Effects and Wave Aberrations in Advanced PSM–Technology", Fraunhofer Institute of Integrated Circuits (11 pages) No date.

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages) No date.

Ishiwata, N., et al., "Fabrication of Phase–Shifting Mask", Fujitsu Limited (11 pages) No date.

Levenson, M., et al., "Phase Phirst! An Improved Strong–PSM Paradigm", M.D. Levenson Consulting, Petersen Advanced Lithography, KLA–Tencor (10 pages) No date.

Levenson, M., et al., "SCAA Mask Exposures and Phase Phirst Design for 110nm and Below", M.D. Levenson Consulting, Canon USA, Inc., JSR Microelectronics, Inc. (10 pages) No date.

Lin, B.J., "The Relative Importance of the Building Blocks for 193nm Optical Lithography", Linnovation, Inc. (12 pages) No date.

McCallum, M., et al., "Alternating PSM Mask Performance—a Study of Multiple Fabrication Technique Results", International SEMATECH (6 pages) No date.

Morikawa, Y., et al., "100nm–alt.PSM Structure Discussion for ArF Lithography", Dai–Nippon Printing Co., Ltd. (15 pages) No date.

Ozaki, T., et al., "A 0.15um KrF Lithography for 1Gb DRAM Product Using Highly Printable Patterns and Thin Resist Process", Toshiba Corporation (2 pages) No date.

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages) No date.

Rosenbluth, A., et al., "Optimum Mask and Source Patterns to Print a Given Shape", IBM (17 pages) No date.

Schmidt, R., et al., "Impact of Coma on CD Control for Multiphase PSM Designs", AMD, ASML (10 pages) No date.

Sewell, H., et al., "An Evaluation of the Dual Exposure Technique", SVG Lithography Systems Inc. (11 pages) No date.

Spence, C., et al., "Optimization of Phase–Shift Mask Designs Including Defocus Effects", AMD, Princeton University, Vecor Technologies Inc. (8 pages) No date.

Suzuki, A., et al., "Multilevel Imaging System Realizing k1=−.3 Lithography", Canon Inc. (13 pages) No date.

Vandenberghe, G., et al., "(Sub−)100nm Gate Patterning Using 248nm Alternating PSM", IMEC, Mentor Graphics (9 pages) No date.

Fritze, M., et al., "100–nm Node Lithography with KrF?", MIT Lincoln Lab, Numberical Technologies, Photronics, Arch Chemicals (14 pages) No date.

Fukuda, H., et al., "Patterning of Random Interconnect Using Double Exposure of Strong–Type PSMs", Hitachi Central Research Lab (8 pages) No date.

Ferguson, R., et al., "Pattern–Dependent Correction of Mask Topography Effects for Alternating Phase–Shifting Masks", IBM Microelectronics, University of California Berkeley (12 pages) No date.

Toublan, O., et al., "Phase and Transmission Errors Aware OPC Solution for PSM: Feasibility Demonstration", Mentor Graphics Corp. (7 pages) No date.

Yanagishita, Y., et al., "Phase–Shifting Photolithography Applicable to Real IC Patterns", Fujitsu Limited (11 pages) No date.

Levenson, M., et al., "Improving Resolution in Photolithography with a Phase–Shifting Mask", IEEE, Transaction On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

Terasawa, T.. et al., "0.3–Micron Optical Lithography Using a Phase–Shifting Mask", SPIE, Optical/Laser Microlithography II, vol. 1088, pp. 25–33, Mar. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Yamanaka, T., et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Teresawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Symposium On VLSI Technology Digest Of Technical Papers, pp. 112–113 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithographic Image Quality", IEEE, pp. 3.3.1–3.3.4 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Lin, B.J., "Phase–Shifting Masks Gain an Edge", IEEE Circuits & Devices, pp. 28–35, Mar. 1993.

Rieger, M., et al., "System for Lithography Proximity Compensation", Precim Company, Portland, Oregon, Sep. 1993 (28 pages).

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1993.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy— Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages) No date.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages) No date.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Cote, M., et al., "A Practical Application of Full–Feature Alternating Phase–Shifting Technology for a Phase–Aware Standard–Cell Design Flow", Numerical Technologies Inc. (6 pages) No date.

Heng, F., et al., "Application of Automated Design Migration to Alternating Phase Sifht Mask Design", IBM Research Report RC 21978 (98769) Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

* cited by examiner

Simulation 2400 (using phase layout 2200 and trim layout 2300)

OPTICAL PROXIMITY CORRECTION FOR PHASE SHIFTING PHOTOLITHOGRAPHIC MASKS

RELATED APPLICATIONS

This application is related to, claims the benefit of priority of, and incorporates by reference, the U.S. Provisional Patent Application Serial No. 60/296,788 filed Jun. 8, 2001 entitled "Phase Conflict Resolution for Photolithographic Masks" having inventors Christophe Pierrat and Michel Côté and assigned to the assignee of the present invention.

This application is related to, claims the benefit of priority of, and incorporates by reference, the U.S. Provisional Patent Application Serial No. 60/304,142 filed Jul. 10, 2001 entitled "Phase Conflict Resolution for Photolithographic Masks" having inventors Christophe Pierrat and Michel Côté and assigned to the assignee of the present invention.

This application is related to, claims the benefit of priority of, and incorporates by reference, the U.S. Provisional Patent Application Serial No. 60/325,689 filed Sep. 28, 2001 entitled "Cost Functions And Gate CD Reduction In Phase Shifting Photolithographic Masks" having inventors Christophe Pierrat and Michel Côté and assigned to the assignee of the present invention.

BACKGROUND OF THE INVENTION

1. Field of the Invention

The present invention relates to manufacturing small dimension features of objects, such as integrated circuits, using photolithographic masks. More particularly, the present invention relates to phase shift masking of complex layouts for integrated circuits and similar objects as well as proximity correction, including but not limited to optical proximity correction and etch proximity correction, for the same.

2. Description of Related Art

Phase shift masking has been applied to create small dimension features in integrated circuits. Typically the features have been limited to selected elements of the design, which have a small, critical dimension. See, for example, U.S. Pat. No. 5,766,806.

Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift windows on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired feature. Thus, it is necessary to prevent inadvertent layout of phase shift windows in phase conflict near features to be formed in the layer defined by the mask.

Another problem involves efficient layout of optical proximity correction OPC features, and other proximity correction features. In one system provided by the assignee of the present invention, known as iN-Phase 4.0 from Numerical Technologies, Inc., San Jose, Calif., a model OPC feature for OPC of gate shrink designs is featured, and OPC of the phase shift pattern along the gate region to correct for light imbalance is provided.

In the design of a single integrated circuit, millions of features may be laid out. The burden on data processing resources for iterative operations over such large numbers of features can be huge, and in some cases makes the iterative operation impractical. The layout of phase shift windows and the assignment phase shift values to such windows, along with the layout of complementary trim mask patterns, for circuits in which a significant amount of the layout is accomplished by phase shifting, is one such iterative operation which has been impractical using prior art techniques.

Because of these and other complexities, implementation of a phase shift masking technology for complex designs will require improvements in the approach to the design of phase shift masks.

SUMMARY OF THE INVENTION

The present invention provides techniques suitable for use with complex phase shift mask patterns and complementary trim mask patterns, which allow for improved proximity correction.

Thus, a method for producing a computer readable definition of photolithographic mask used to define a target pattern is provided. For the purposes of this description, the phase shift mask patterns and trim mask patterns include shapes having boundaries that are defined by sets of line segments. The phase shift mask patterns include phase shift windows, and the trim mask patterns include trim shapes, which have boundaries defined by such sets of line segments. For a particular pair of phase shift windows used to define a target feature in a target pattern, each of the phase shift windows in the pair can be considered to have a boundary that includes at least one line segment that abuts the target feature. Likewise, a complementary trim shape used in definition of the target feature, for example by including a transmissive region used to clear an unwanted phase transition between the particular pair of phase shift windows, includes at least one line segment that can be considered to abut the target feature. According to the present invention, proximity correction is provided by adjusting the position of the at least one line segment on the boundary of a phase shift windows in said pair which abuts the target feature, and by adjusting the position of the at least one line segment on the boundary of the complementary trim shape which abuts the target feature.

In one embodiment, the at least one line segment on the phase shift windows is defined by dissecting boundaries of the phase shift windows in the pair of phase shift windows at dissection points that are selected according to the shape of the phase shift windows. For example, the dissection points are selected so that they occur along the edge of the target feature at positions corresponding to corners of the phase shift windows. In addition, the at least one line segment on the trim shape is selected by dissecting boundaries of the trim shape at dissection points selected according to the shape of the trim shape. Again, for example the dissection points on the trim shape are selected so that they occur along the edge of the target feature at positions corresponding to corners of the trim shape.

In another embodiment, the pair of phase shift windows discussed in the preceding paragraph includes a complementary phase shift window by which a phase transition is produced that results in formation of at least a part of the target feature. The line segments for the phase shift windows in the pair are defined by dissecting a boundary of the phase shift window at a dissection point at corner of the phase shift window which abuts an edge of the target feature caused by the phase transition. Likewise, the line segments of the trim shape are defined by dissecting the boundary of the trim shape at dissection points at the corner of the trim shape which abuts an edge of the target feature caused by the phase transition.

Another embodiment of the invention provides a method for performing optical proximity correction for a target feature of integrated circuit layout. In this embodiment, the layout is accomplished using a full phase pattern that comprises a first phase shift window and the second phase shift window. The first and second phase shift windows have respective sides comprising at least one line segment abutting the target feature. A phase transition between the first and second phase shift windows cause an artifact to be trimmed. For example, the first and second phase shift windows may abut the sides of intersecting line segments in the target pattern, and create a phase transition at the inside corner of the intersection that would create an artifact to be trimmed. A trim shape comprising at least one line segment abutting the target feature is used to trim the artifact. According to the present invention, at least one line segment of the first phase shift window and at least one line segment of the trim shape that abut the target feature are identified. Proximity correction is performed by adjusting the positions of both the identified at least one line segment of the first phase shift window and the identified at least one line segment of the trim shape. Said adjusting includes for example offsetting the at least one line segment of the phase shift window and the at least one line segment of the trim shape from adjacent line segments defining boundaries of the features, preferably in a direction which is orthogonal to the adjacent line segments that define boundaries of features.

Another embodiment of the invention includes layout a first mask pattern including phase shift windows having boundaries defined by line segments in a first mask layout, and a second mask pattern including trim shapes having boundaries defined by line segments in the second mask pattern. In this embodiment, the combination of the first and second mask patterns is used for defining a target pattern in which at least a part of an exposure feature caused by a phase transition between a pair of phase shift windows in the first mask pattern is cleared by a transmissive region in a trim shape in the second mask pattern to define a portion of the target feature. Next, the invention includes adjusting the position of a line segment defining boundaries of the pair of phase shift windows in the first mask pattern that create said exposure feature to be cleared by the transmissive region, and the position of a line segment defining boundaries of the transmissive region in the second mask layout to provide for proximity correction for the target feature. Next, a result of the laying out and adjusting is stored in a computer readable medium.

In yet another embodiment, these techniques are applied to phase shift windows and trim shapes used for definition of inside corners of target features. In a further embodiment, these techniques are applied to phase shift windows and trim shapes used for definition of outside corners of target features.

According to another aspect of the present invention, a computer readable definition of the photolithographic mask is provided that define the pattern in a layer to be formed which includes a target feature having first and second outside corners form by intersections of first, second and third edges of the target feature. According to this embodiment of the invention, a method includes laying out a first mask pattern including phase shift windows and a second mask pattern including trim shapes, wherein the first and second mask patterns are used in combination for defining the first and second outside corners of the target feature. The first mask pattern including first and second a shift windows having opposite phases and abutting the first and second edges of the target feature near the first outside corner, and the third phase shift window having the same phase as the first phase shift window and abutting the third edge of the feature near the second outside corner. A first phase transition occurs between the first and second patient windows in a location near the first outside corner and cause an exposure feature tending to extend in a line away from the first outside corner. A second phase transition occurs between the second and third phase shift windows in a location near the second outside corner, and causes an exposure feature tending to extend in a line away from the second outside corner. The second mask pattern includes a trim shape having a first transmissive region corresponding to a location of the first phase transition for clearing at least a portion of the exposure feature caused by the first phase transition such that the first outside corner is sharper in a resulting image, and has a second transmissive region corresponding to the location of the second phase transition for clearing at least a portion of the exposure feature caused by the second phase transition such that the second outside corner is sharper in the resulting image. Proximity correction adjustments are applied to one or both of the first and second mask patterns. The result is stored in a computer readable medium.

Other aspects of the invention include an article of manufacture that comprises a computer readable storage medium with computer readable instructions stored thereon for executing the layout processes just described. Further, lithographic masks are provided that include one or more masks having phase shift mask patterns and trim mask patterns laid out as described. Also, a method for manufacturing integrated circuits is provided based upon use of mask patterns that are laid out as described.

In various embodiments of the invention, the trim mask pattern defines binary shapes only. In other embodiments, the trim mask pattern includes one or more of tricolor shapes, attenuated phase shift windows, and attenuated opacity shapes.

Further aspects and advantages of the present invention can be understood upon review of the figures, the detailed description and the claims which follow.

BRIEF DESCRIPTION OF THE FIGURES

The file of this patent contains at least one drawing executed in color. Copies of this patent with color drawing(s) will be provided by the Patent and Trademark Office upon request and payment of the necessary fee.

DETAILED DESCRIPTION

Overview

Figure 2:
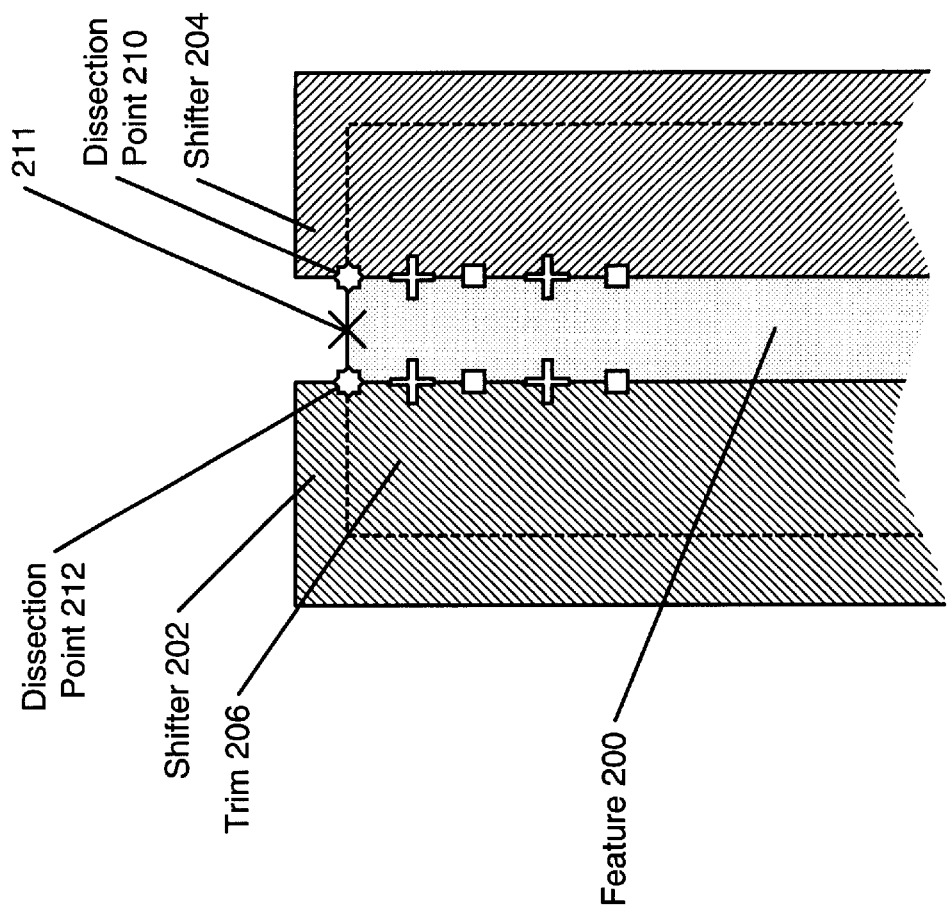
FIG. 2 shows the placement of dissection and evaluation points on both phase and trim patterns for a straight line layout.

Optical proximity correction (OPC) involves modification of one or more layouts that will be used in the production of a layer of material to correct for optical effects of the exposure of a mask in lithography equipment for integrated circuit (IC) production. (Note, as used herein, the term mask includes the term reticle.)

The OPC process involves adding and removing hammerheads, serifs, and the like to the pattern (composed of structures and/or features) in a layout so that a mask made from the pattern in the resulting corrected layout will more accurately produce the desired original, or reference, pattern from the target layout on the finished IC. Proximity correction for other artifacts of the lithographic process, including etch proximity effects for example, is also possible using such modifications.

More particularly, the application of OPC to layouts designed for producing substantially all portions of a layout pattern will be considered. The techniques described apply to other types of proximity correction as well. First, the types of layouts being considered will be discussed in greater detail. Next, the selection of dissection and evaluation points for OPC on such layouts will be considered in greater detail. Then, OPC of corners will be considered in greater detail with reference to the layout of the phase shift layout and phase assignment. Finally, example layouts together with trim masks and sample exposure results will be considered.

Layouts

In one embodiment of the invention, substantially all portions of a pattern in a layout are being defined using a phase shifting mask. Masks for such layouts are sometimes referred to as "full phase" masks. In one embodiment, the layouts are defined according to the process described in U.S. patent application Ser. No. 09/932,239 filed Aug. 17, 2001, entitled "Phase Conflict Resolution for Photolithographic Masks" having inventors Christophe Pierrat and Michel Côté, and assigned to the assignee of the present invention, which is incorporated herein by reference.

In another embodiment, a phase shifting layout that produces substantial portions of a pattern of an IC using phase shifting comprises a phase shifting layout where substantially all features for a particular layer are defined using phase shifting. In another embodiment, a phase shifting layout that produces substantial portions of a pattern of an IC using phase shifting comprises a layout such that only features that are non-critical for the binary exposure are non-phase shifted.

In other embodiments, the relevant layout comprises a layout where at least one of:

- eighty percent (80%) of non-memory portions in one layer of material in the layout;
- eighty percent (80%) of a part of the floorplan in one layer of material;
- eighty percent (80%) of cells in a given area;
- ninety percent (90%) of a layer of material;
- ninety five percent (95%) of a layer of material;
- ninety nine percent (99%) of a layer of material;
- one hundred percent (100%) of a layer of material;
- one hundred percent (100%) of a in a functional unit of the chip (e.g. ALU) in one layer of material;
- one hundred percent (100%) of features in a layer of material that are in the critical path of the design;
- one hundred percent (100%) of features in a layer of material above or below certain dimensions, e.g. all features with a critical dimension 50 $\mu$m<CD<100 $\mu$m;
- everything in a layer of material except those features that cannot be phase shifted due to phase conflicts that cannot be resolved;
- everything in a layer of material except test structures; and
- one hundred percent (100%) of all non-dummy features, e.g. features providing structural support for processing purposes, and non-electrically functional features in a layer of material are defined using phase shifting.

In one embodiment, the percentages are computed based on the percentage of edges, or OPC edge segments, defined using phase shifting. Turning briefly to FIG. 2, the edge between the dissection point 210 and the dissection point 212 is defined by the trim mask while the remaining edges of the feature 200 are defined using the phase shifting mask. In other embodiments, the percentage is determined by area.

The remainder of this application will consider OPC on layouts meeting one or more of the above criterion.

Dissection and Evaluation Points and OPC Process

The OPC process itself may be a rule based or a model based OPC process, or both. If a rule based process is used, the rules may be constructed through examination of the performance of model based OPC process according to the methods described herein. The trade off between the two is usually quality (model based generally produces better results) for time (rule based is generally faster).

The model based OPC process will now be considered in greater detail as follows. First, some terminology and information about model based OPC will be discussed. Next, setup and dissections for: a straight line, an inner corner, an outer corner, and a more complex pattern, will be considered. Finally, a process flow for model based OPC on layouts where substantially all portions of a pattern in a layout are being defined using a phase shifting mask will be considered.

Model Based OPC Terminology

Model based OPC involves the simulation of the optical effects of a user selected lithography process to a given layout at evaluation points placed within a pattern of a layout.

In one embodiment, the lithography process is modeled using an optical model generated by the ModelGen(TM) software produced by Numerical Technologies, Inc., of San Jose, Calif. The ModelGen software allows for the description of the characteristics of the optical lithography system being used including, among other things, the wavelength of light ($\lambda$), the numerical aperture (N.A.), the coherency of the light (e.g., $\sigma$) for each exposure, the type of illumination (off-axis, quadrapole, etc.), etc.

That optical model can be calibrated for the particular process and lithographic stepper or scanner by making a test exposure and measuring the critical dimension (CD) of test features. The calibration can be accomplished by providing the test measures to the ModelCal(TM) software produced by Numerical Technologies, Inc. of San Jose, Calif. Other embodiments of the invention can support optical models generated or be used in conjunction with software from tools from Avant! Corporation, Fremont, Calif., and Mentor Graphics Corporation, Wilsonville, Oreg.

Together with an optical model, calibrated or otherwise, OPC parameters are provided for the positioning of dissection and evaluation points by the OPC process. The OPC parameters include measurements that can be given as a segment length, e.g. 60 nm, 120 nm, etc. The segment length describes how far apart, and thus how frequently, or infrequently, line segments that make up features or structures in the pattern in the layout are dissected and evaluated. The OPC software may allow different segment lengths for different types of features, e.g. outer corner, inner corner, straight line, etc.

In one embodiment, the TROPiC(TM) software, the iN-Phase(TM), the iN-Tandem(TM) software and/or the Photolynx(TM) software from Numerical Technologies, Inc., are used to provide model based OPC as described more fully below. In other embodiments, the OPC process is performed using software provided by Avant! and/or Mentor Graphics.

Figure 1:
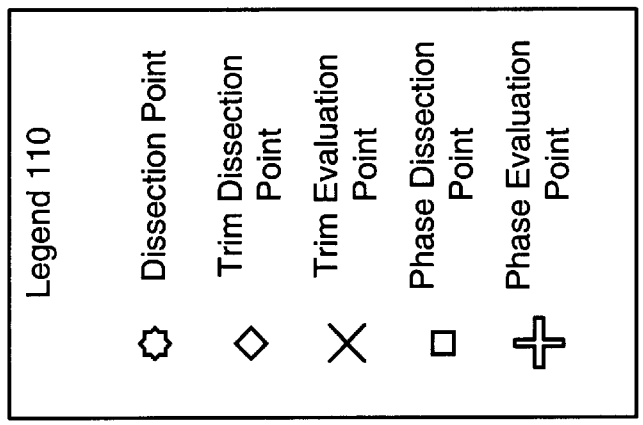
FIG. 1 is a legend showing symbols that will be used in subsequent figures.

FIG. 1 is a legend showing symbols that will be used in subsequent figures. More specifically, FIG. 1 includes a legend 110. Dissection points in subsequent figures for both the trim pattern and the phase shifting layer will be shown as an eight cornered "Petronas towers" shape of a square intersected with a rotated square. Dissection points for the trim patterns will be shown as a diamond. Dissection points for the phase shift pattern will be shown as a square. Evaluation points for trim layouts will be shown as an X and evaluation points for phase layouts as plus marks. These symbols will facilitate a better understanding of the placement of dissection and evaluation points used by embodiments of the invention.

Straight Line Dissection

FIG. 2 shows the placement of dissection and evaluation points on both phase and trim patterns for a straight line layout. FIG. 2 includes a target feature 200, a straight line. The feature 200 is an element of a target layout, which the phase shift mask and trim mask are designed to implement. This feature 200 presents a target that includes elements formed by the phase transition between the shifters 202 and 204, and an element, that is the line end, defined by the trim 206. The shifter 202 and the shifter 204 represent opposite phase, light transmissive regions on a phase shifting layout for producing the feature 200. The phase shifting layout will make use of a dark field mask and the area between, and around, the shifter 202 and the shifter 204 will be nontransmissive (opaque), e.g. chrome, etc.

The binary trim layout includes the trim 206 shown as a dashed line (the dashed outline follows, and is obscured by, the solid line of the feature 200 along the top edge of the feature 200). The binary trim layout can be a bright field mask for use in conjunction with the phase shifting mask to define the feature 200. Opaque areas in the trim mask protect features of the target layout formed by the phase shift mask that are part of the target feature. Transmissive areas in the trim mask are used to clear unwanted exposure features caused by the phase shift mask. Also, transmissive areas are used to refine or delimit features caused by the phase shift mask so that they more closely match the target layout. For example, transmissive areas in the trim mask are used to define line ends for lines that are formed using phase transitions in the phase shift mask.

Turning to OPC of the phase layout. Dissection and evaluation will occur where the phase layout abuts the target layout, e.g. the feature 200. FIG. 2 shows a portion of the dissection and evaluation points for the shifter 202 and the shifter 204. The dissection and evaluation points are placed along the full length of the edges of the shifters where the shifters abut the feature 200 in some embodiments of the invention; see e.g. FIG. 4 and FIG. 5.

Turning to OPC of the trim layout, the trim 206 (opaque rectangle overlying feature 200 and portions of shifters 202 and 204) includes dissection and evaluation points where the trim 206 abuts the feature 200, e.g. along the top edge of the feature 206. In this example, the dissection points 210, 212 and evaluation point 211 for the trim pattern and the phase shift pattern along the top edge of feature 200 are at positions in the respective patterns that correspond to the same location on the target feature. More specifically, in this example, the dissection point 210 and the dissection point 212 are used in defining OPC segments in both layers. However, more generally, the placement of the dissection points and evaluation points can be determined for particular layouts based on the edge segments where the transmissive feature of the trim pattern abuts the target layout and the dissection/evaluation segment length criterion being used. In this example, the trim 206 is used to define an end of the feature 200 between the points 210 and 212, and to protect the rest of the feature 200 formed by the phase transition between shifters 202 and 204.

Summarizing, according to one embodiment of the invention, the trim and phase shift patterns are dissected only where they abut the original (target) layout. Once the dissection and evaluation points have been placed, OPC (and other proximity correction adjustments) can be performed. The dissection of an inner corner will now be considered.

Inner Corner Dissection

Figure 3:
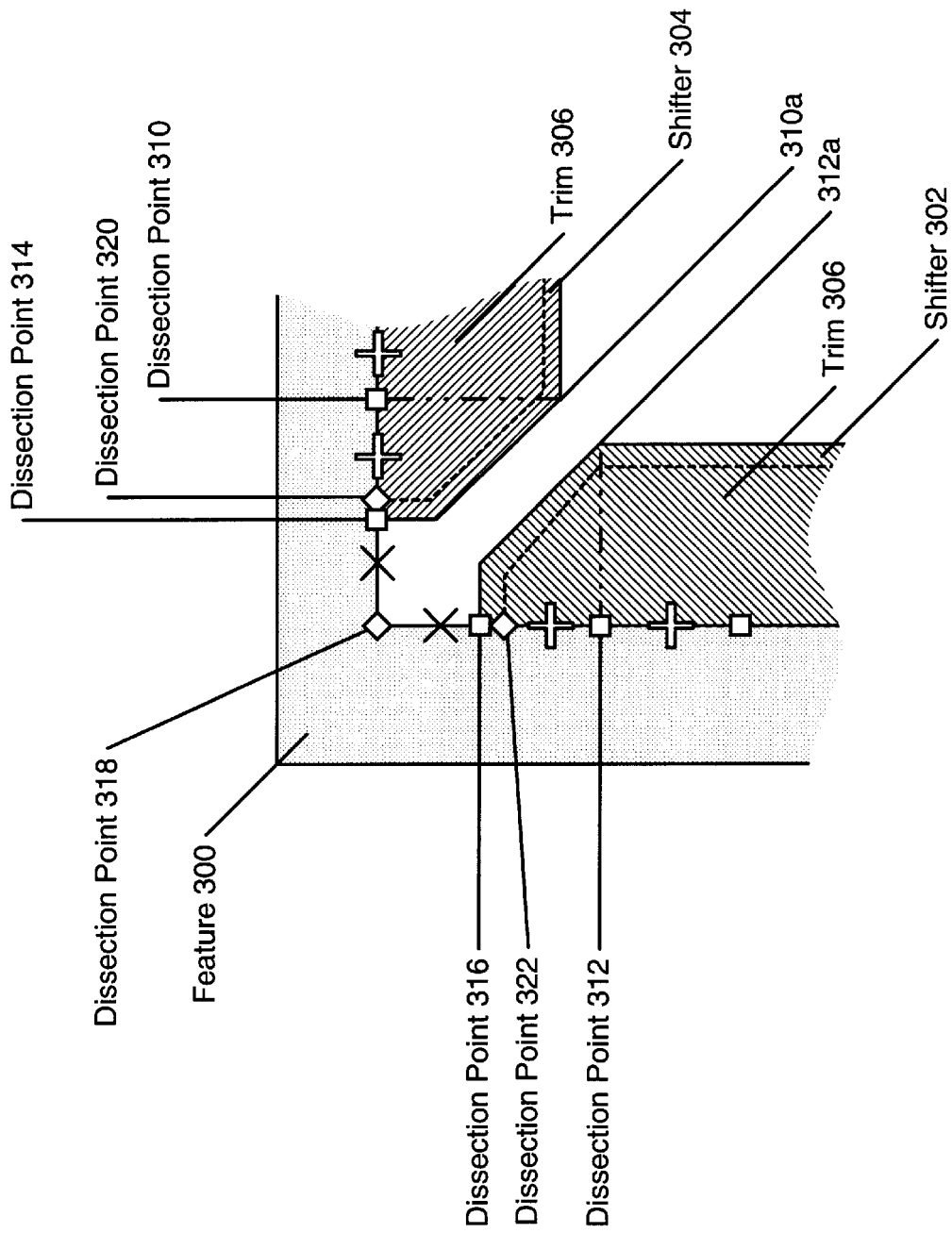
FIG. 3 shows the placement of dissection and evaluation points on both phase and trim patterns for an inner corner.

FIG. 3 shows the placement of dissection and evaluation points on both phase shift patterns and trim patterns for an inner corner. More specifically, FIG. 3 includes a feature 300 and shows respective portions of the phase shift and trim patterns that will be used to define the feature 300. The phase shift pattern includes two shifters, a shifter 302 and a shifter 304. Shifters on the opposite side of the feature 300 that would allow the feature 300 to be completely defined by phase shifting are not shown. One side of the outline of the trim 306 on the trim pattern in the corner is shown as a dashed line. (Note: the trim 306 follows, and is obscured by, the boundary of the feature 300 on the inside corner through points 322, 318, 320. See, e.g. FIG. 19 and FIG. 23 for full examples of the shape of trim patterns.) As in FIG. 2, several dissection and evaluation points are omitted from the figure to focus on the inner corner area; see FIG. 4 and FIG. 5 for more complete examples.

The gap between the shifter 302 and the shifter 304 and can also be referred to as a "cut." In a dark field phase mask produced from the layout, this gap will be nontransmissive on the phase shift mask. The corresponding trim mask typically includes a transmissive area in the region of the cut to clear any unwanted exposure caused by the phase transition between the shifter 302 and the shifter 304. In one embodiment of the invention, the size and shaping of the cuts on the phase shift mask are designed to support easy mask manufacturability and/or satisfaction of design rule checking. In one embodiment, the gap areas make use of 45 degree and ninety degree angles. In another embodiment, an inner corner cut is formed by a substantially square shaped notch with a forty-five (45) degree angle straight line out of one corner to separate the two shifters. The separation between the shifters along the cut is designed to obey any minimum spacing rules for one or more of mask manufacturability and/or design rule checking. Unless stated otherwise, the cuts and angles shown in the figures will be at 45 and 90 degrees. Other embodiments of the invention can support handling of patterns with features aligned and positioned with non-Manhattan geometries (e.g. non 45/90 degree angles); however, such embodiments may make use of shifters and cuts while using Manhattan geometries in the cut shapes to the extent possible.

FIG. 3 highlights several dissection points for the phase shift pattern, more specifically the dissection point 310, the dissection point 312, the dissection point 314, and the dissection point 316 are shown. The dissection point 314 and the dissection point 316 have been positioned proximate to the junction of the respective shifter 304 and shifter 302 and the feature 300. Additionally, the dissection point 310 and the dissection point 312 have been positioned in line with the point (310*a* and 312*a*, respectively) where the full width of the shifter begins, as shown by the dotted-and-dashed line extending from the dissection points to the full width of the respective shifter 304 and shifter 302. However, in some embodiments those dissection points are only substantially inline with the beginning of the full width of the shifter. In other embodiments, those dissection points are further into the full width portion of the shifter by a small amount, e.g. a few nanometers.

FIG. 3 shows distinct trim pattern dissection points where the trim 306 meets the feature 300, e.g. the dissection point 320 and the dissection point 322. Accordingly, in this embodiment the trim pattern dissection segments will run from the dissection point 318 to the dissection point 322 and the dissection point 320. This supports differing OPC corrections for the phase and trim patterns. However, if desired the dissection point 314 and the dissection point 316 can be used in OPC of the trim pattern. The dissections for an outer corner will now be considered.

Outer Corner Dissection

Figure 4:
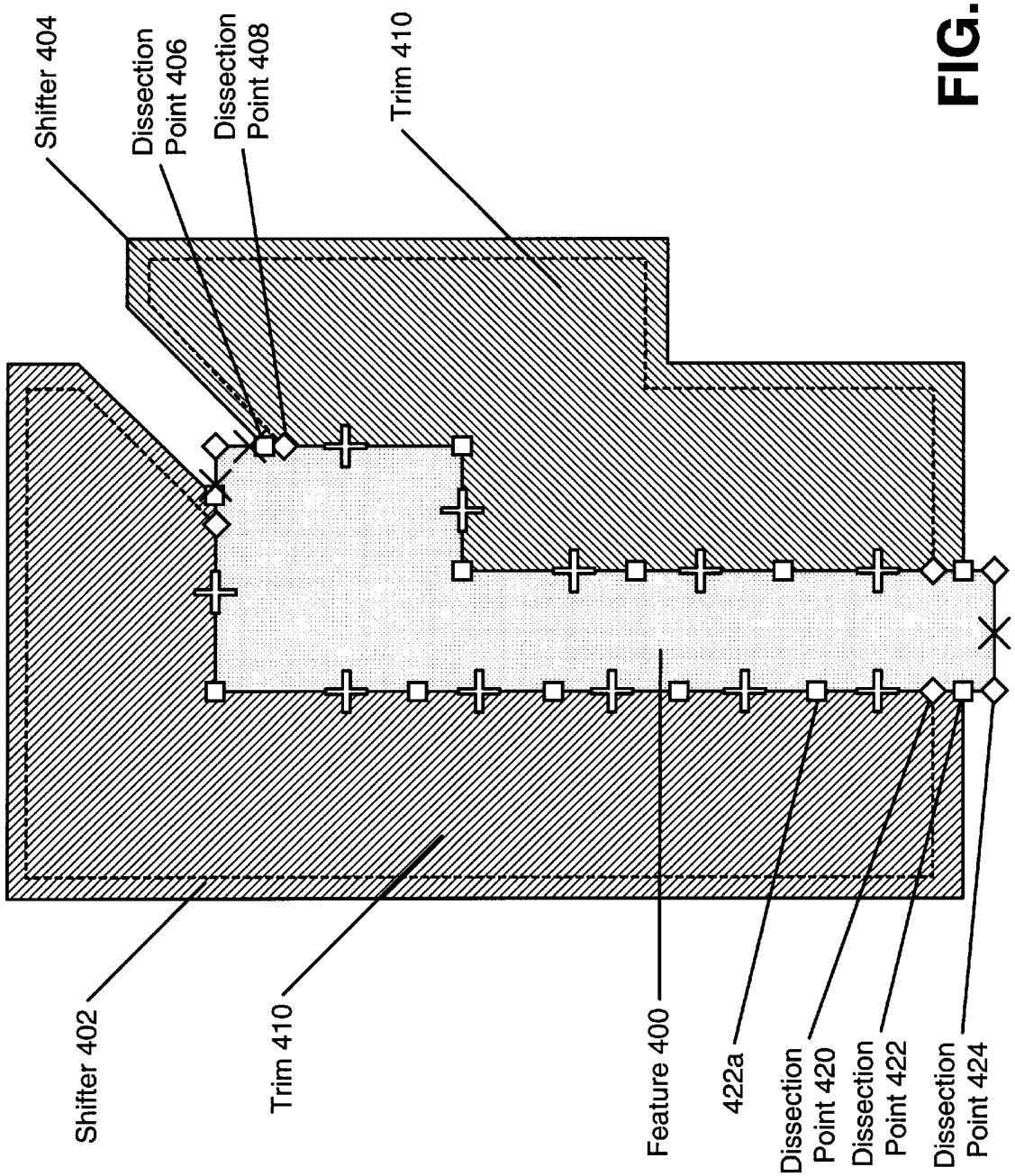
FIG. 4 shows the placement of dissection and evaluation points on both phase and trim patterns for an outer corner.

FIG. 4 shows the placement of dissection and evaluation points on both phase and trim patterns for an outer corner. Here a feature 400 will be defined using the shifter 402 and the shifter 404. The outline of the trim pattern is not explicitly shown; however, several of the dissection points are positioned at the intersection of the trim pattern and the feature 400. Specifically, contrast dissection point 406 and dissection point 408. Dissection point 406 is positioned where the shifter 404 meets the feature 400 while the dissection point 408 is positioned where the trim 410 meets the feature 400. As noted, this facilitates different OPC corrections for the phase and trim patterns. Note also the corresponding dissection points on the other edge of the corner, not labeled.

Turning more closely to the bottom portion of the feature 400, three dissection points: the dissection point 420, the dissection point 422, and the dissection point 424, are shown. The dissection point 420 and the dissection point 424 form an OPC segment along the feature 400 for the trim pattern. However, because in this example the segment is too small relative to the selected OPC parameters, no evaluation point is placed. The dissection point 422 forms an OPC segment for the phase shift pattern with the dissection point 422*a* further up the feature 400 where the shifter 402 and the feature 400 abut in the phase shift pattern.

Also note that the cut between the shifter 402 and the shifter 404 is of a similar shape and structure to the cut used between the shifters in FIG. 3. Here, the 45 degree opening stretches out of the upper corner and towards a square end. The shape of the cut is designed to be design rule checker (DRC) clean and/or to support better mask manufacturability.

Before turning to a process flow for the OPC process a more complex dissection will now be considered.

Complex Dissection

Figure 5:
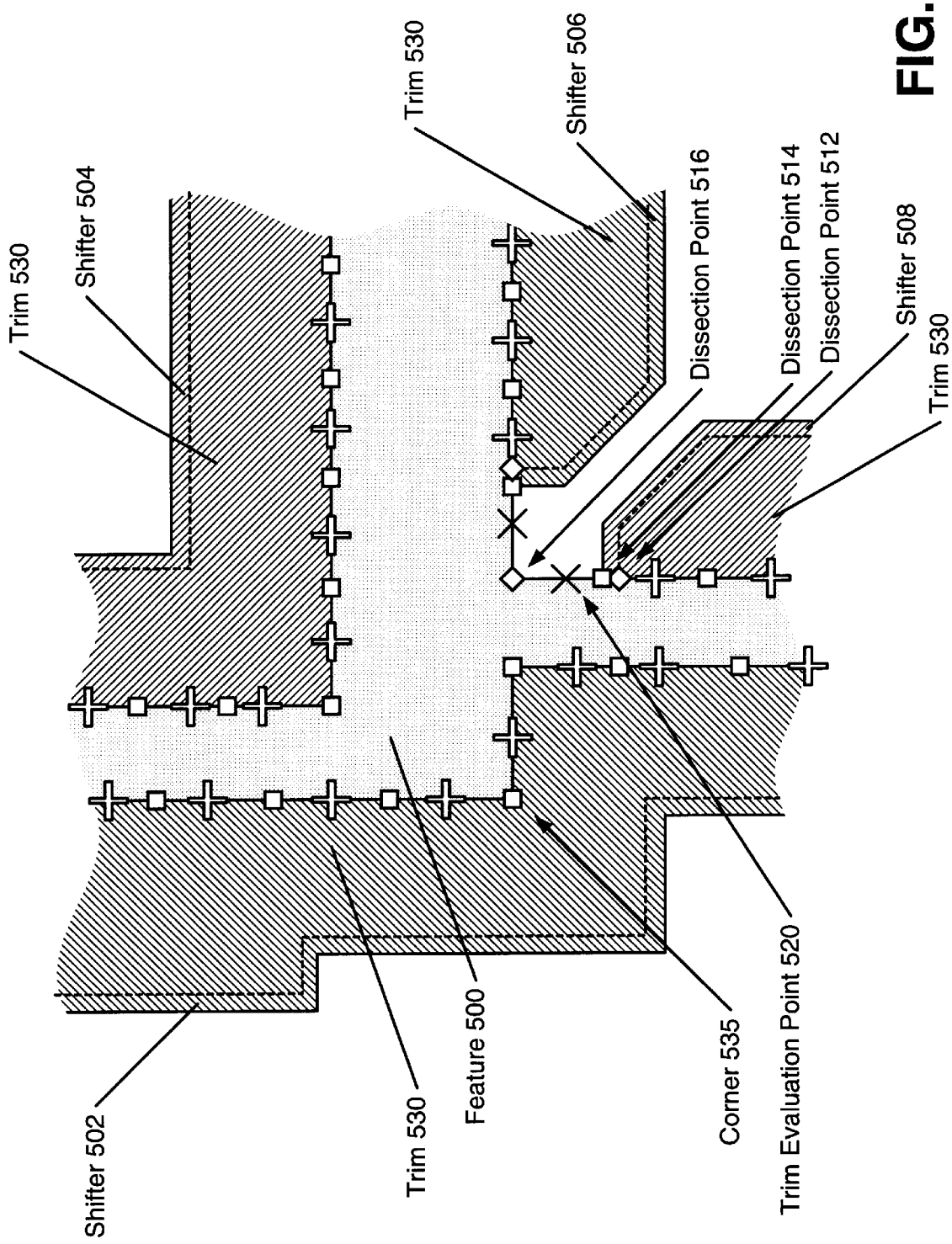
FIG. 5 shows the placement of dissection and evaluation points on both phase and trim patterns for a complex pattern.

FIG. 5 shows the placement of dissection and evaluation points on both phase and trim patterns for a complex pattern including the feature 500. Four shifters, the shifter 502, the shifter 504, the shifter 506, and the shifter 508 will be used to define the feature 500. As in FIG. 4, the outline of the trim pattern 530 is shown as a dashed line.

FIG. 5 illustrates the use of different dissection points for the phase and trim pattern at the inside corner cut of the shifter 506 and the shifter 508. FIG. 5 includes separate dissection points for where the trim pattern meets the original feature. Specifically, FIG. 5 includes the dissection point 512 and the dissection point 516 for the trim pattern. Note in this example that the trim evaluation point 520 is approximately midway between the two dissection points. In contrast, the dissection point 514 is at the intersection of the shifter 508 with the feature 500 and is a phase shift pattern dissection point. The corresponding dissection and evaluation points for the shifter 506 are shown without reference numerals, for clarity of illustration. Compare area around the trim dissection point 516 with the area around the corner 535 where there is only phase layer. Note the absence of overlapping OPC segments since only the phase layer will be adjusted.

Now, a process for performing OPC on layouts where substantially all portions of a pattern in the layout are being defined using a phase shifting mask will be considered in greater detail.

Process Flow

Figure 6:
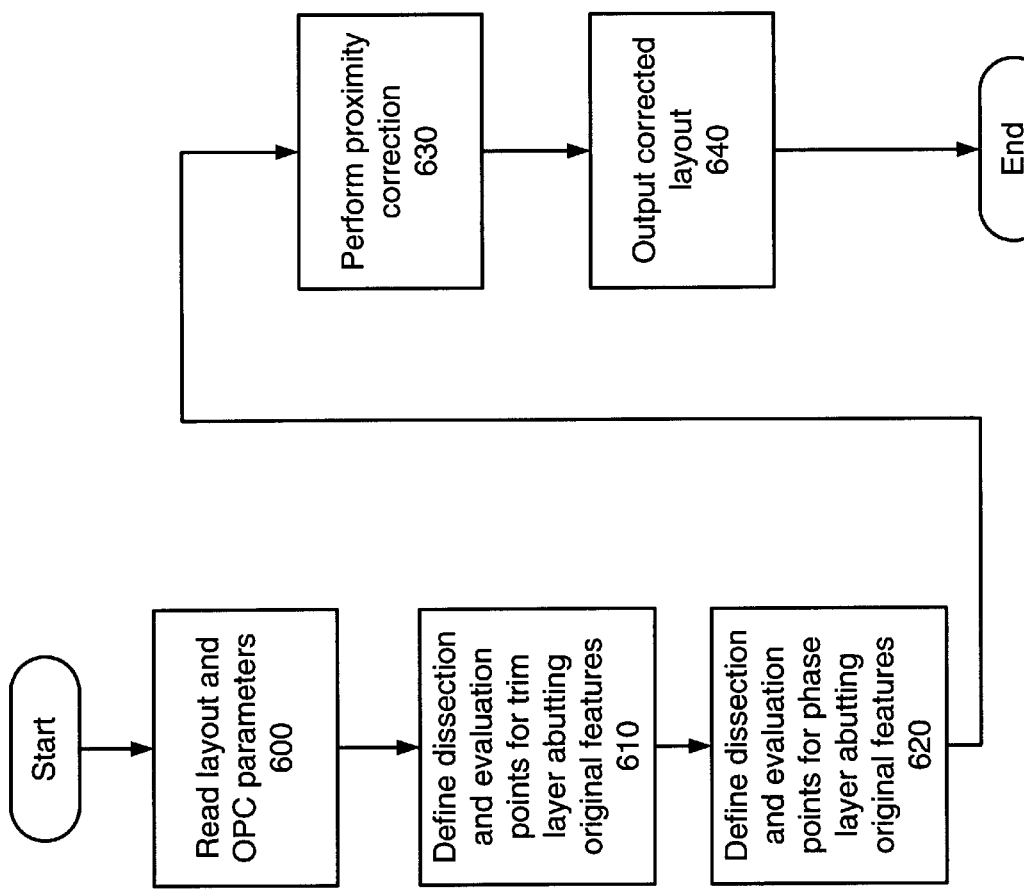
FIG. 6 is a process flow diagram for setting up and performing optical proximity correction (OPC) for a layout.

FIG. 6 is a process flow diagram for setting up and performing optical proximity correction (OPC) for a layout. This process flow could be used to setup the OPC dissections seen in FIGS. 2–5 and then to perform the appropriate optical proximity correction. This process is designed for use on layouts where substantially all portions of a pattern in the layout are being defined using a phase shifting mask.

The process starts at step 600, as OPC parameters and the layout (phase shift and trim patterns) to be corrected are loaded. In one embodiment, the OPC parameters include information about the process, e.g. an optical model, optionally calibrated, is provided at this stage. Additionally, settings such as the frequency of evaluation and dissection for different types of line segments within the layout can be provided. As noted previously, a model based OPC process is considered here, if a rule based OPC is used, the process can be suitably adapted. Loading the layout may involve loading the layout data, e.g. from a GDS-II stream format file, a mask electron beam exposure system (MEBES) format, and/or some other suitable format. In some embodiments, the layout may be in the memory of the computer system performing the process of FIG. 6. For example, if a set of one or more UNIX(R) workstations is being used to perform the process of FIG. 6, the layout might be loaded from a network attached storage device into memory.

In some embodiments, the layout loaded at step 600 is a non-phase shifted layout. In such embodiments, a conversion process may be performed to convert the input layout to a layout where substantially all portions of a pattern in the layout are being defined using a phase shifting mask prior to continuing the process at step 610. This conversion can be performed according to some embodiments as described in U.S. patent application Ser. No. 09/932,239. In one embodiment, the conversion to a phase shifting layout and the process of FIG. 6 can both be performed by a suitable version of the iN-Phase(TM) software from Numerical Technologies, Inc.

The process continues at step 610 with definition of dissection and evaluation points. In some embodiments step 610 and step 620 operate in parallel. In other embodiments, the order is swapped with step 620 performed prior to step 610. In still other embodiments, the steps are combined into a single step that defines evaluation and trim points for both layers.

More specifically, the dissection points are placed along edge segments of the trim pattern and the phase shift pattern according to the OPC parameters. For example, the OPC parameter might specify that all edge segments are to be dissected every 120 nm. Other embodiments, might allow greater selectivity, e.g. for corners, etc. Once the dissection points are placed, the evaluation points can be placed in relation to or on the edge between a pair of dissection points. Returning to FIG. 2, at step 610, the only portion of trim abutting the feature 200 is the top edge and the length of that edge is such that only the two dissection points can be placed. Then an evaluation point is positioned between those dissection points. As noted, the evaluation point need not be placed directly on the edge segment and multiple evaluation points could be used for a given segment.

In either case, at step 630, optical proximity correction can be performed. In one embodiment a model based OPC process is used. In another embodiment a rule based OPC process is used. In another embodiment a hybrid, or mixed mode, OPC process is used. In one embodiment, the mixed mode OPC process of U.S. patent application Ser. No. 09/514,551 entitled "Method And Apparatus For Mixed-Mode Optical Proximity Correction" filed Feb. 28, 2000, and assigned to the assignee of this application, is applied to the layout at step 630.

The result, at step 640, is a corrected layout that can be output, e.g. to screen, disk, network attached storage, Internet, etc. The output layout might even be directly transmitted to a mask making machine, e.g. input in GDS-II stream format and output in MEBES for use in mask making. Other formats may be used in some embodiments of the invention, including proprietary formats used by such companies as Hitachi, Toshiba, Jeol, Leica, etc.

In one embodiment, an instance based (IB) representation of the layout is used for performing the process of FIG. 6. An IB representation is described more fully in U.S. patent application Ser. No. 09/835,313 having a filing date of Apr. 13, 2001 and inventors Chin-Hsen (Michael) Lin, et. al., and assigned to the assignee of the present invention.

Now corner OPC will be considered in greater detail with reference to several simulations.

Corner OPC

Figure 8:
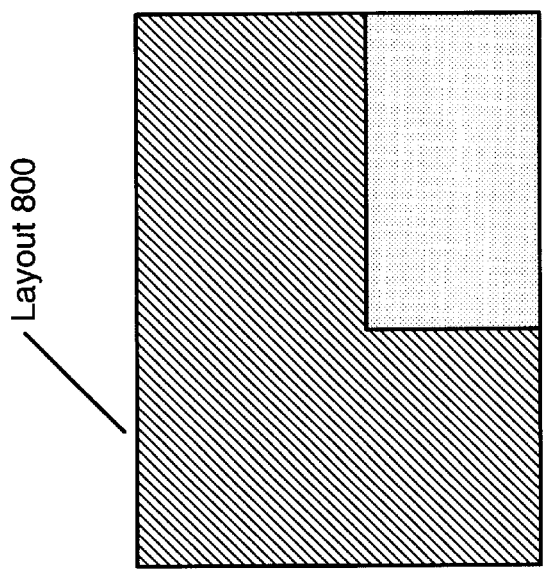
FIG. 8 shows a layout with a corner with a single, uncut, phase shifter prior to OPC.
Figure 7:
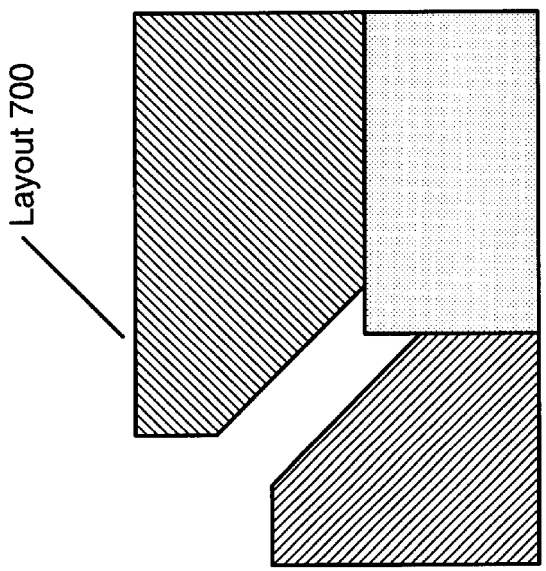
FIG. 7 shows a corner with the phase shifters separated by a cut prior to OPC correction.

Turning to FIGS. 7–8, a corner from a layout is shown. Specifically, FIG. 7 shows a layout 700 and FIG. 8 a layout 800. Except for the configuration of the phase shifters, the layouts are identical. In the layout 700, the corner is defined using two opposite phase shifters separated by a cut. In the layout 800, a single, uncut phase shifter is used. Neither layout has yet been corrected with OPC.

Figure 10:
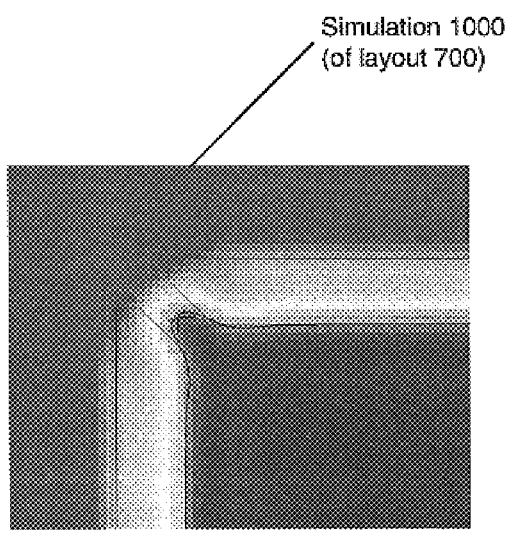
FIG. 10 is a simulation of the uncorrected layout of FIG. 7.
Figure 11:
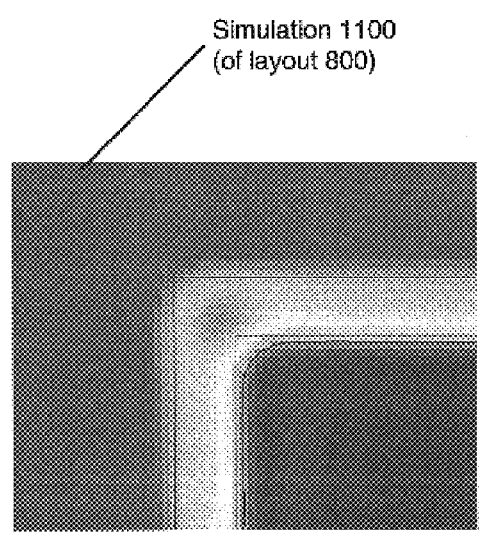
FIG. 11 is a simulation of the uncorrected layout of FIG. 8.

Simulations of the two layouts are shown in FIGS. 10–11, respectively. The two simulations were performed with identical parameters and a coherency ($\sigma$)=0.5. FIG. 10 shows a simulation 1000 of the layout 700 and FIG. 11 shows a simulation 1100 of the layout 800. Note that without application of OPC, the image contour for the printed image is closer to the target layout for the layout 700 than the layout 800. (Note, the phase shifters are shown as yellow lines and the trim pattern outline as a dark blue/black line in FIGS. 10–11.)

Figure 9:
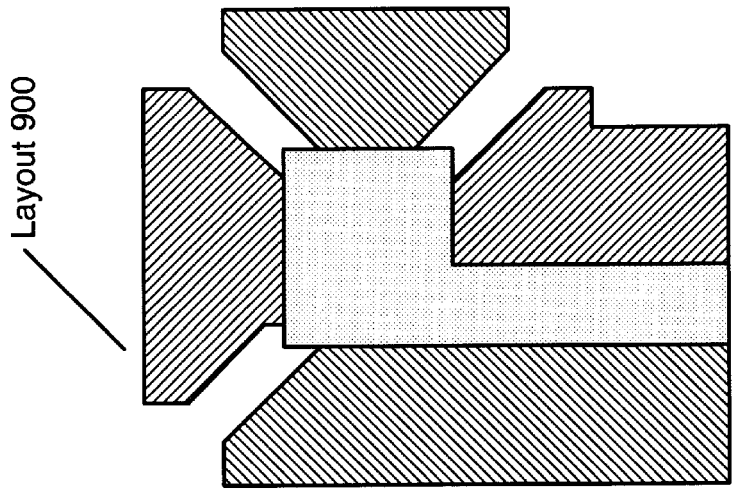
FIG. 9 shows a layout with a contact defined using phase shifters prior to OPC.
Figure 12:
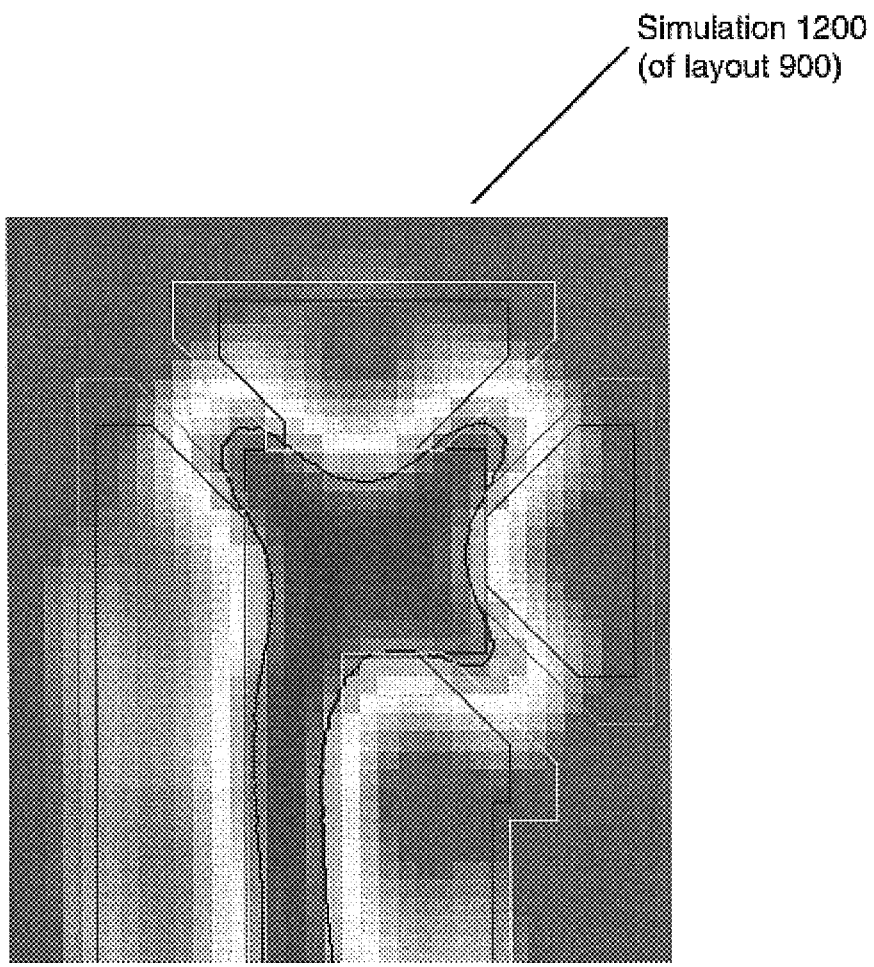
FIG. 12 is a simulation of the uncorrected layout of FIG. 9.

FIG. 9 further considers the tradeoffs between the number of cuts and the amount of OPC that will be needed. FIG. 9 illustrates a layout 900 for a landing area; the phase shifters defining the contact have been cut at every corner. The result: sharper corner definitions as seen in FIG. 12 showing a simulation 1200 for that uncorrected layout 900.

Figure 13:
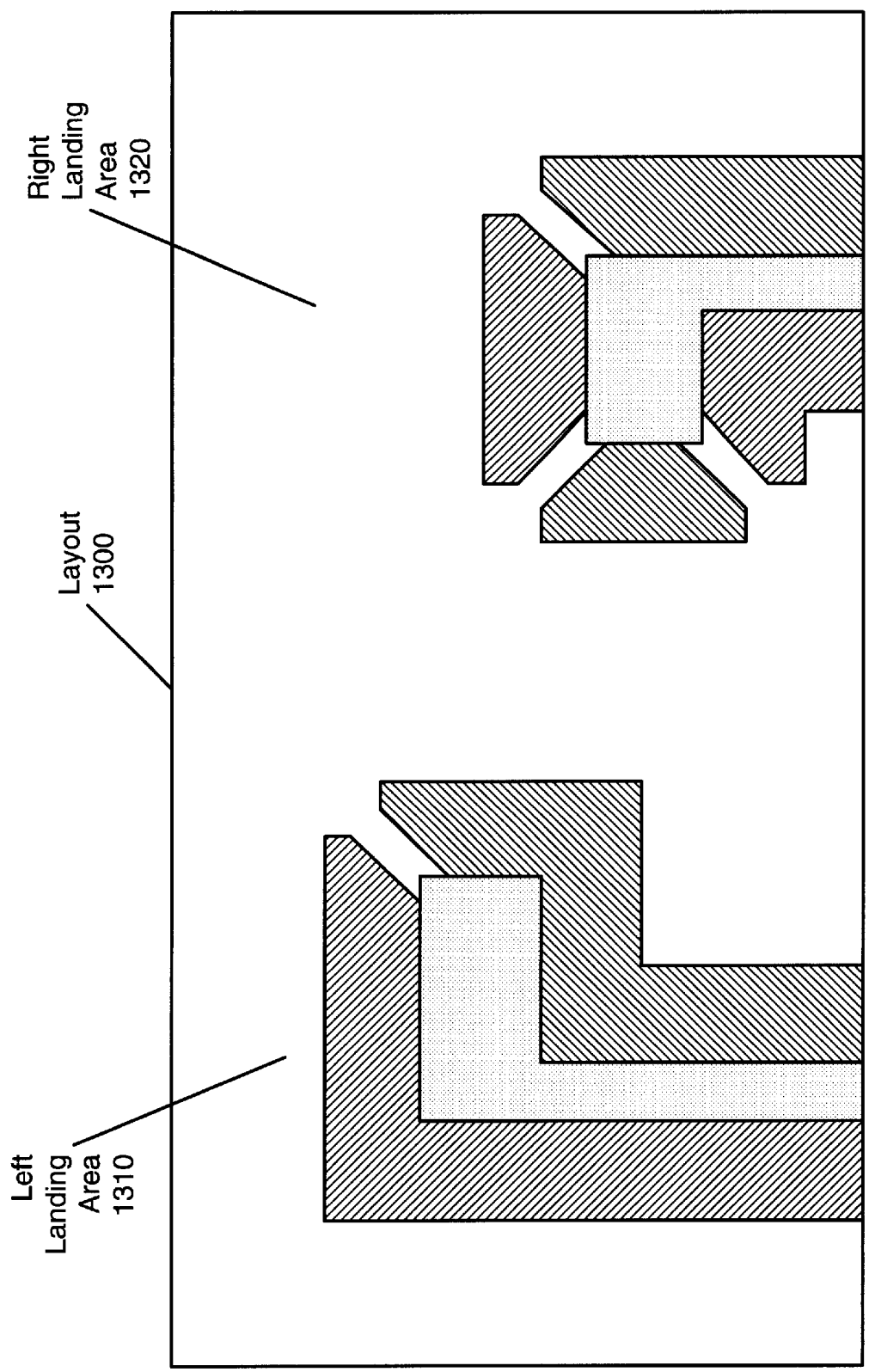
FIG. 13 shows a layout with two contacts, one with a phase conflict and the other with the conflict removed.
Figure 14:
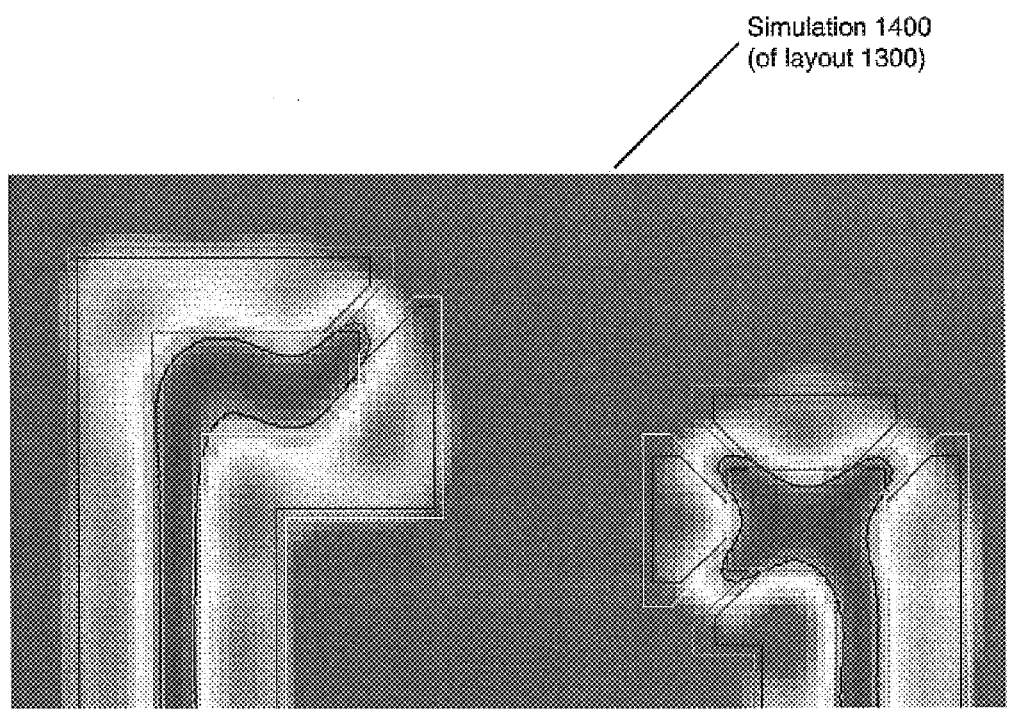
FIG. 14 is a simulation of the uncorrected layout of FIG. 13.

FIGS. 13–14 further illustrate this with FIG. 13 showing a layout 1300 including two landing areas, a left landing area 1310 and a right landing area 1320. Again, maximizing the number of cuts, right landing area 1320, improves corner definition without OPC as shown in FIG. 14 that includes the simulation 1400.

Figure 15:
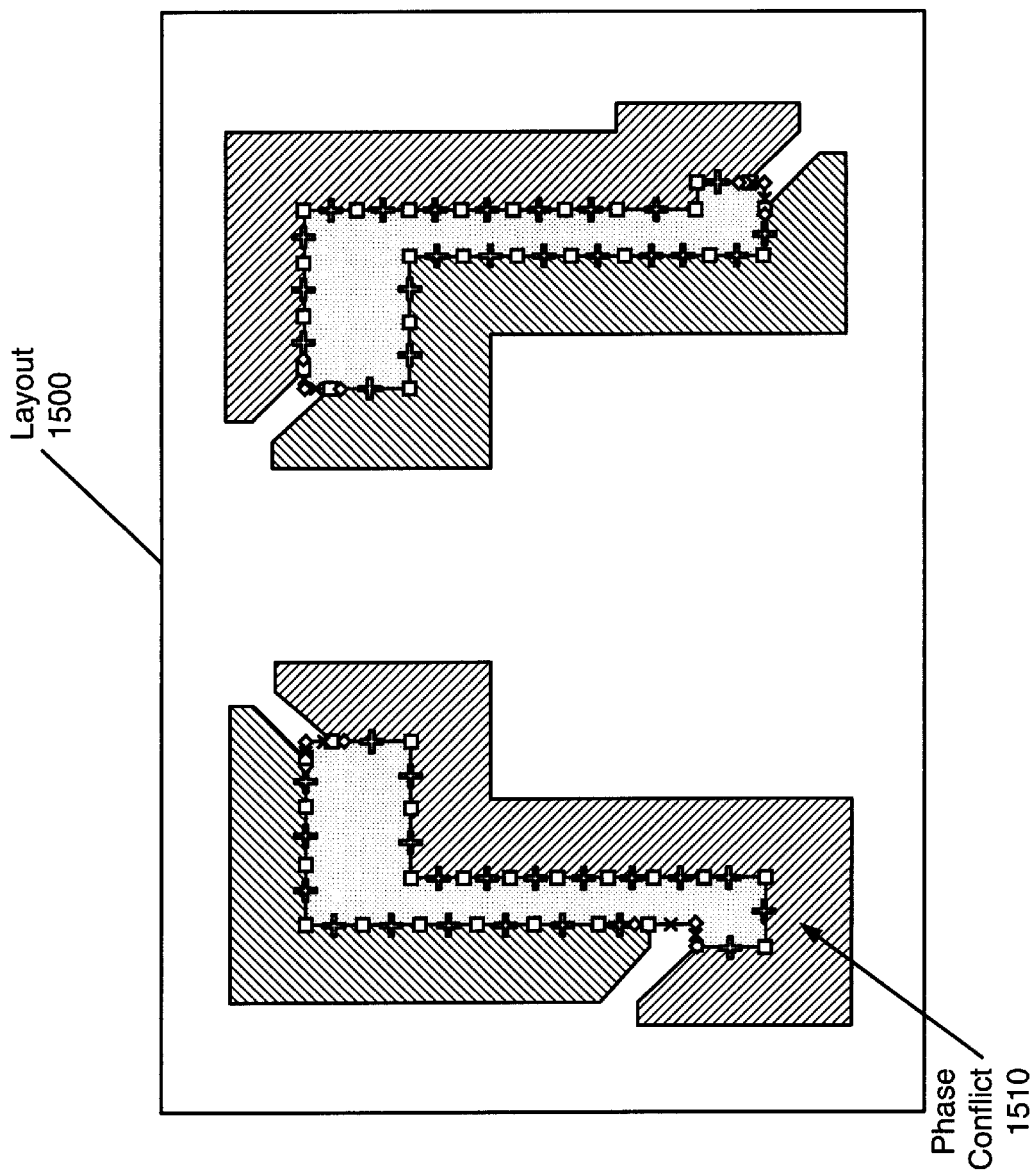
FIG. 15 shows a layout with two copies of feature each defined using a different phase shifter arrangement.
Figure 16:
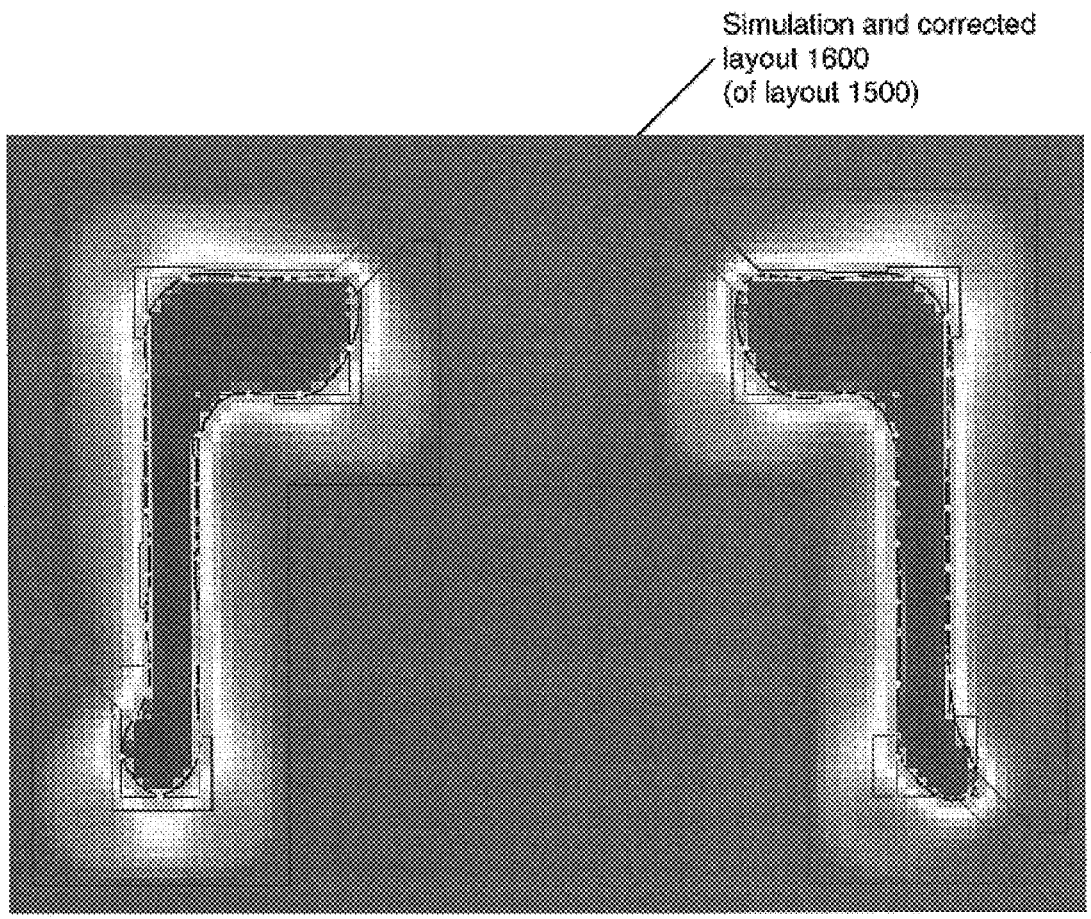
FIG. 16 is a simulation of the corrected layout of FIG. 15.

However, there can be circumstances where leaving the phase conflict can produce better results as shown in FIGS. 15–16. As shown, FIG. 15 includes the layout 1500 and the left hand copy of the feature includes a phase conflict 1510 where the shifter is not of the appropriate phase to facilitate the definition of the feature. Contrast that with the right hand copy of the feature where all phase conflicts have been removed. The dissection and evaluation points used for both arrangements are shown as well.

The layout 1500 was dissected and corrected according to the process of FIG. 6 using parameters of 120 nm/120 nm/120 nm/120 nm indicating the minimum segment length, the maximum segment length, the outer corner segment length, and the inner corner segment length, respectively. An outline of the OPC correction is visible in dark blue/black inside the simulation 1600 results of FIG. 16. (Both the corrected trim and corrected phase shift patterns are shown in dark blue/black.)

Here, a layout with a phase conflict produces better results. Accordingly, some embodiments of the invention when defining the phase shift pattern attempt to maximize the number of cuts for contacts and corners to reduce the need for OPC correction. In contrast, other embodiments, may perform simulations for a given feature, structure, or pattern, to select a phase assignment strategy for the given feature. For example, if the OPC parameters are known when the phase shifting layout is defined a simulation of the type used to generate FIGS. 10–12, 14 and 16 can be used and the critical dimension and corner variance computed. However, this approach is likely remain computationally infeasible for layouts for real world designs. As such, other embodiments may use rule or shape tables to select strategies.

For example, a rule table might specify that contacts should receive the maximum number of cuts where possible, while another more specific rule might identify shapes like the ones of FIG. 15 where a phase conflict should be maintained.

In some embodiments, one or more cost functions are defined to select when and how to cut the phase shift regions that will define the features of the layout. In some embodiments the cost functions are designed to minimize the number of divisions taken, e.g. favor layout like the left landing area 1310 over the right landing area 1320. However, some embodiments of the invention use cost functions that take into account features and patterns on other layers. For example, if a contact was positioned inside the right landing area 1320, then the cost function might favor maximizing the number of cuts to improve containment of the contact.

Finally, two additional layouts will be considered along with detailed examples of the phase mask after optical proximity correction and the trim masks as well.

FURTHER EXAMPLES

Example 1

Figure 17:
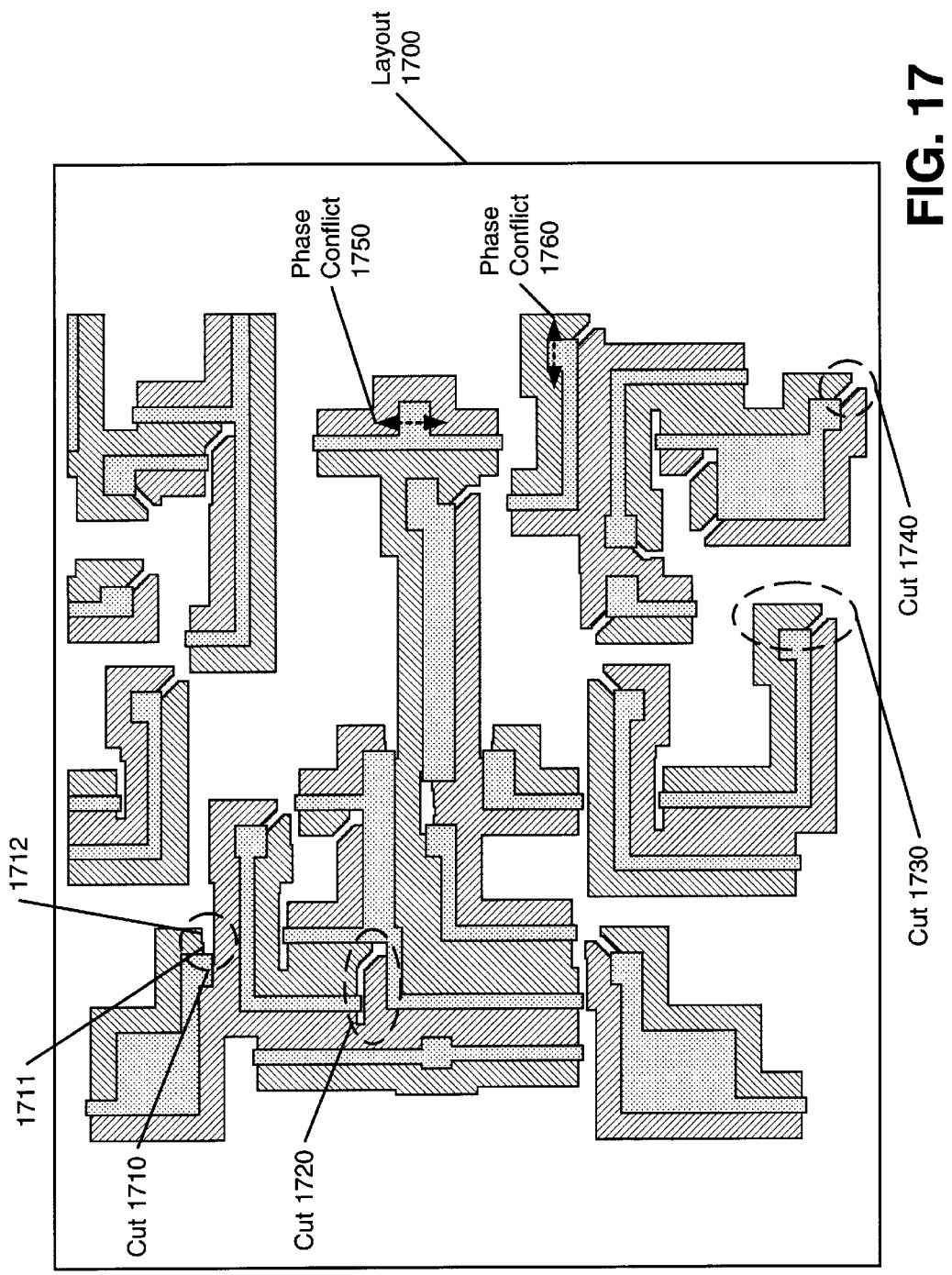
FIG. 17 shows a portion of a complex layout.

FIG. 17 shows a portion of a layout 1700, the layout 1700 extends past the area shown. The layout includes a plurality of features being defined using phase shifters. Several aspects of the layout bear mention.

Particularly, the cut 1710 should be contrasted with the cut 1740. In the case of the cut 1710, a diagonal cut of the type used for the cut 1740 was not possible so a straight line cut was used instead. Also, the adjustment for proximity correction in cut 1710 includes offsetting of a line segment 1711 in a direction orthogonal to adjacent line segment 1712 on the phase shift pattern.

In a similar vein, cuts are extended where appropriate, e.g. the cut 1720 is an extended corner cut that was made contiguous with a no longer distinctly visible cut for the endcap.

The finished layout also includes several phase conflicts, two of which, the phase conflict 1750 and the phase conflict 1760, are called out. Another phase conflict also exists near the cut 1730. If the cut 1730 had been moved from the bottom right corner of the contact to the upper right corner, the phase conflict in that region would be removed.

Figure 18:
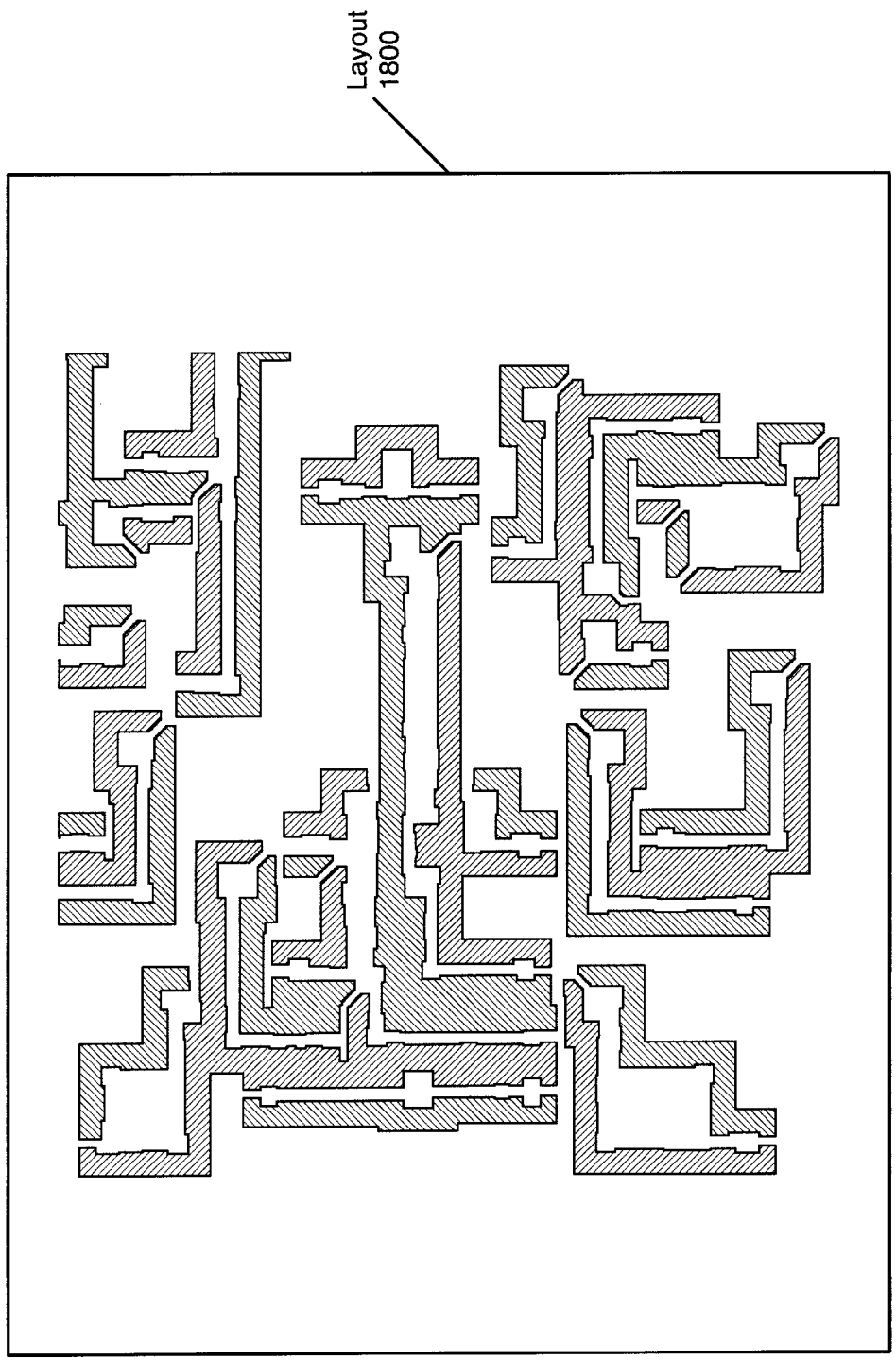
FIG. 18 shows the phase shift pattern for the layout of FIG. 17 after OPC has been performed.

In this example, the phase conflicts remaining in the layout will be compensated for—to the extent possible—by OPC according to the process of FIG. 6. In FIG. 18 the layout 1800 for the OPC corrected phase shift pattern is shown. The OPC was performed only on portions of the phase shift pattern that abut the location of the target layout.

Figure 19:
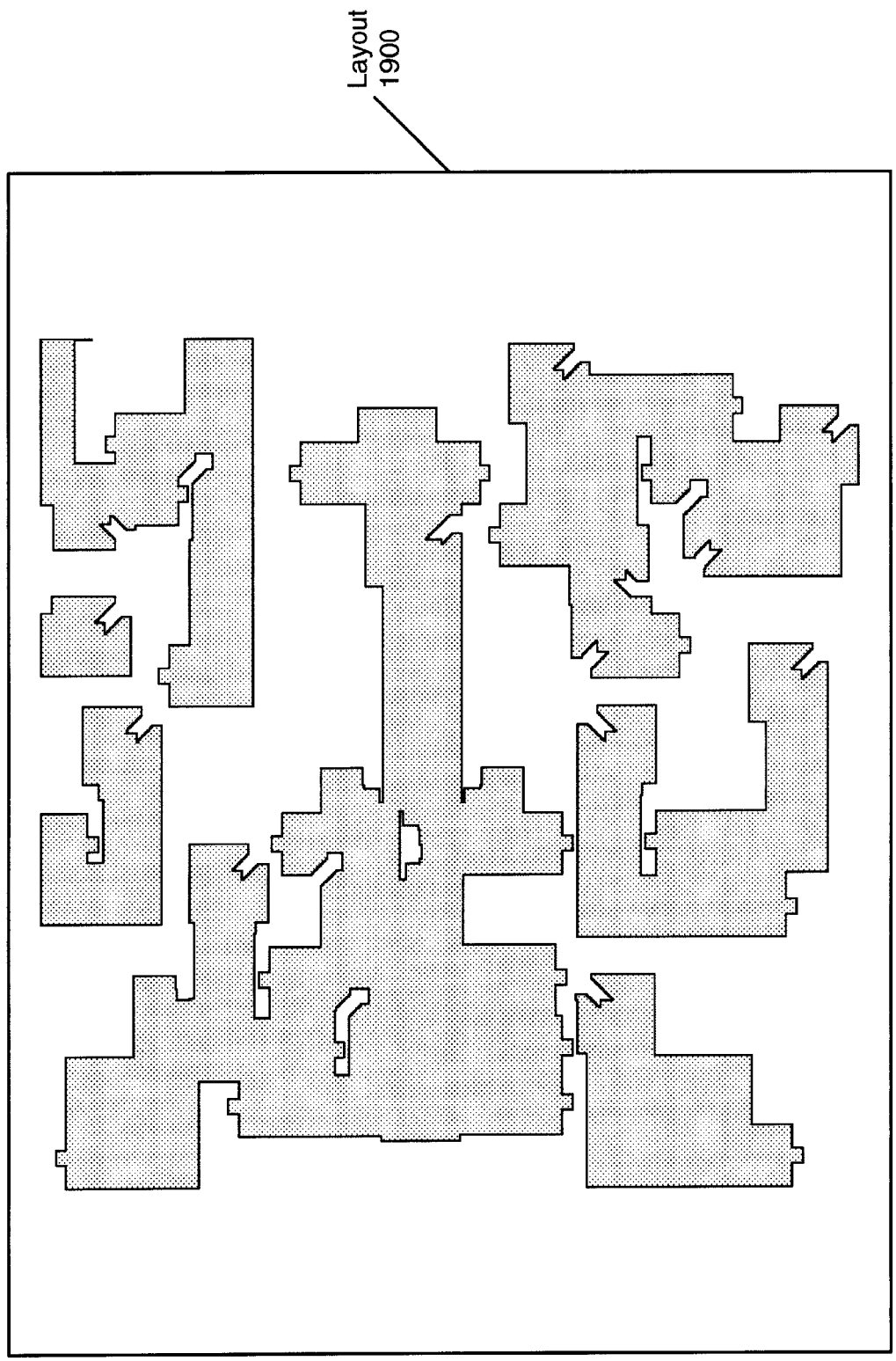
FIG. 19 shows the trim pattern for the layout of FIG. 17.

Similarly, FIG. 19 shows the layout 1900 for the OPC corrected trim layout.

Figure 20:
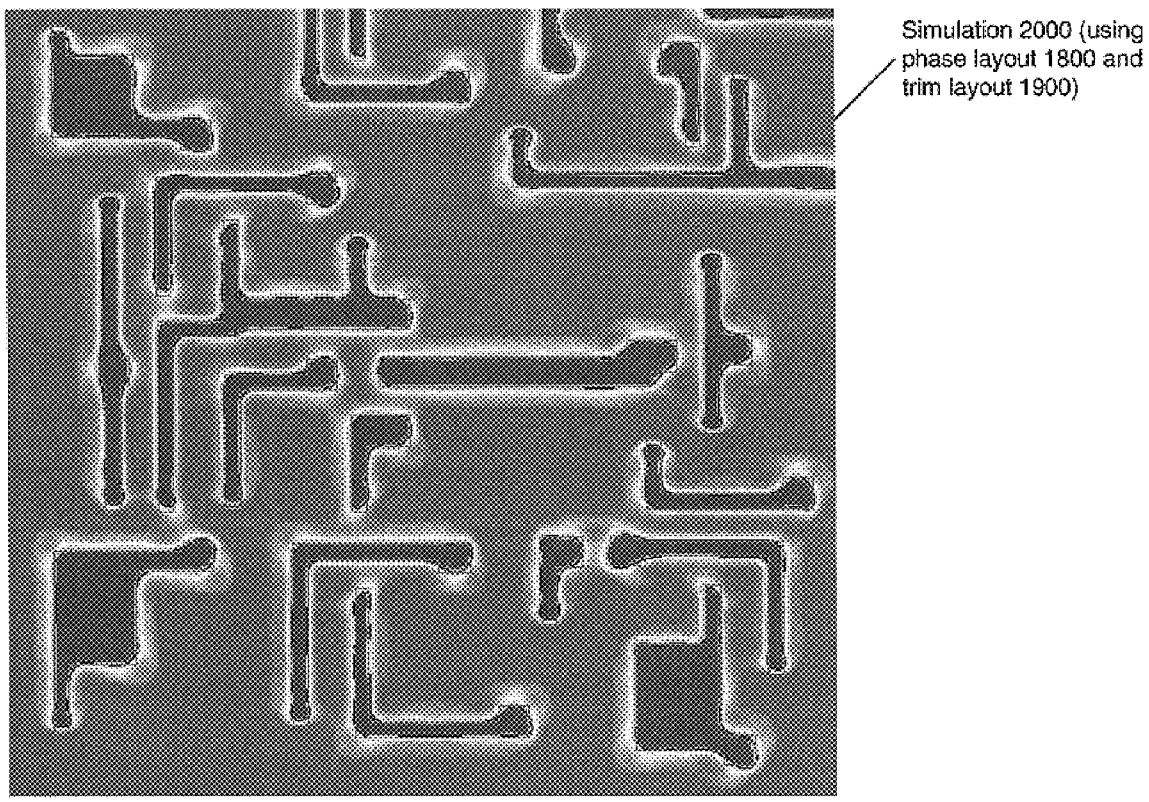
FIG. 20 shows the simulated exposure for the layout of FIG. 17 using the phase and trim patterns of FIGS. 18–19.

Finally, FIG. 20 includes the simulation 2000 of the printed image of the phase layout 1800 used in combination with the trim layout 1900. The target layout is shown as a dark blue/black line.

Reviewing the simulation 2000, it is apparent that the phase conflicts were not an issue as the features in the layout were defined. Additionally, measurements can be taken to verify whether or not the simulated printed image meets specifications. In this example it does.

Example 2

Figure 21:
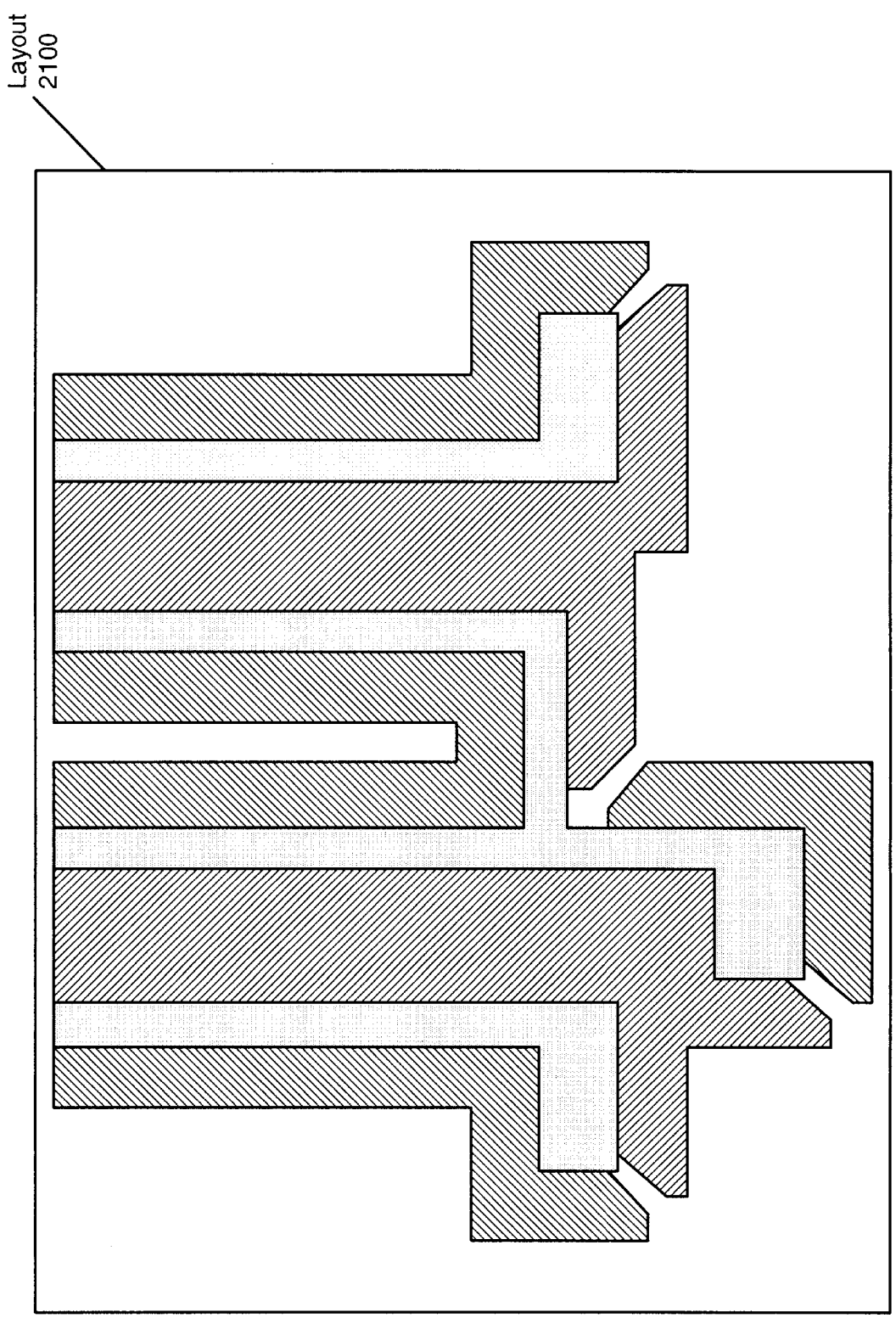
FIG. 21 shows a portion of a complex layout.

FIG. 21 shows a portion of a layout 2100, the layout 2100 extends off the shown edges. The layout includes a plurality of features being defined using phase shifters, shown. The portion of the layout shown has been completely phase shifted without conflicts.

Figure 22:
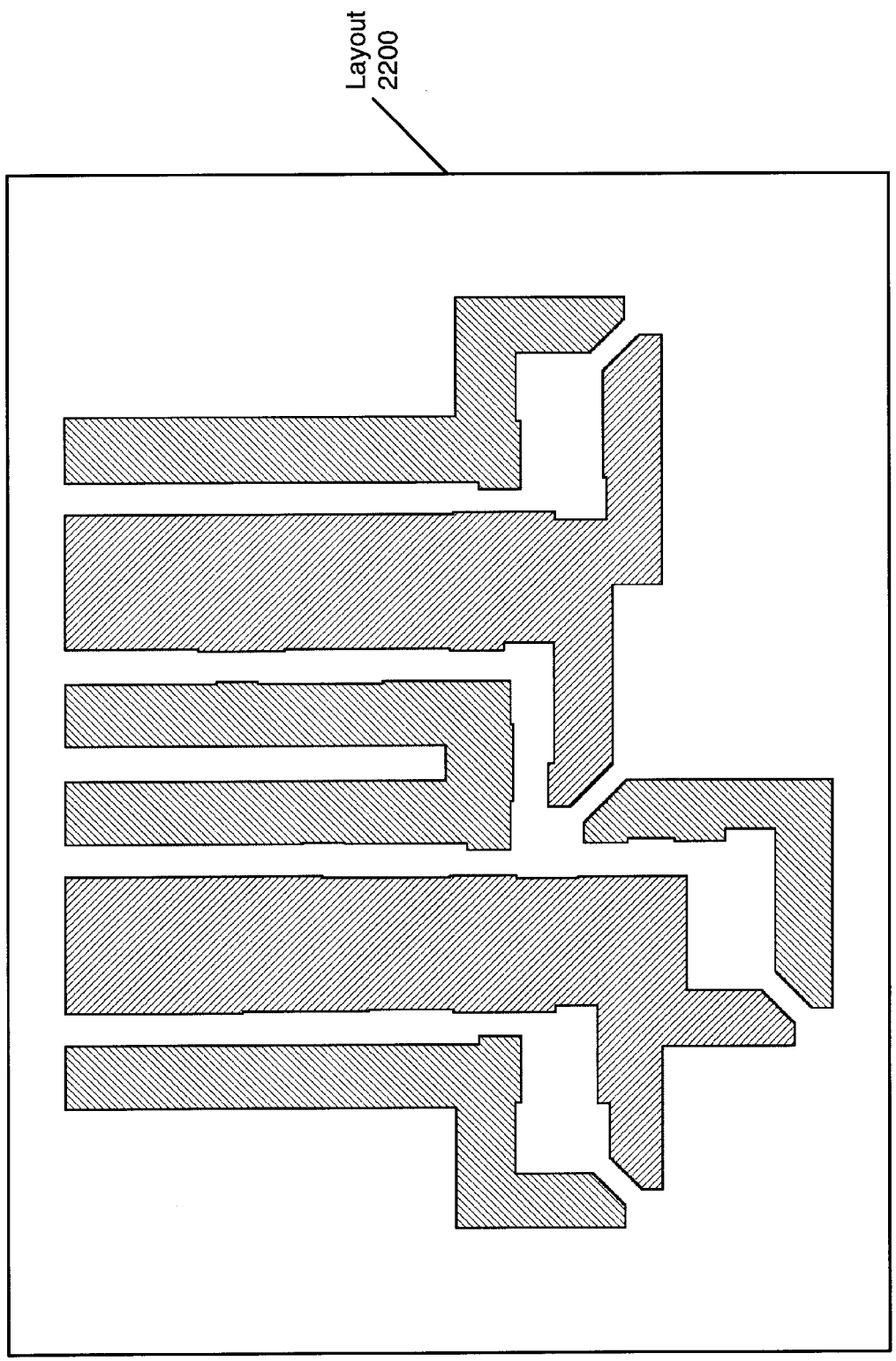
FIG. 22 shows the phase shift pattern for the layout of FIG. 21 after OPC has been performed.
Figure 23:
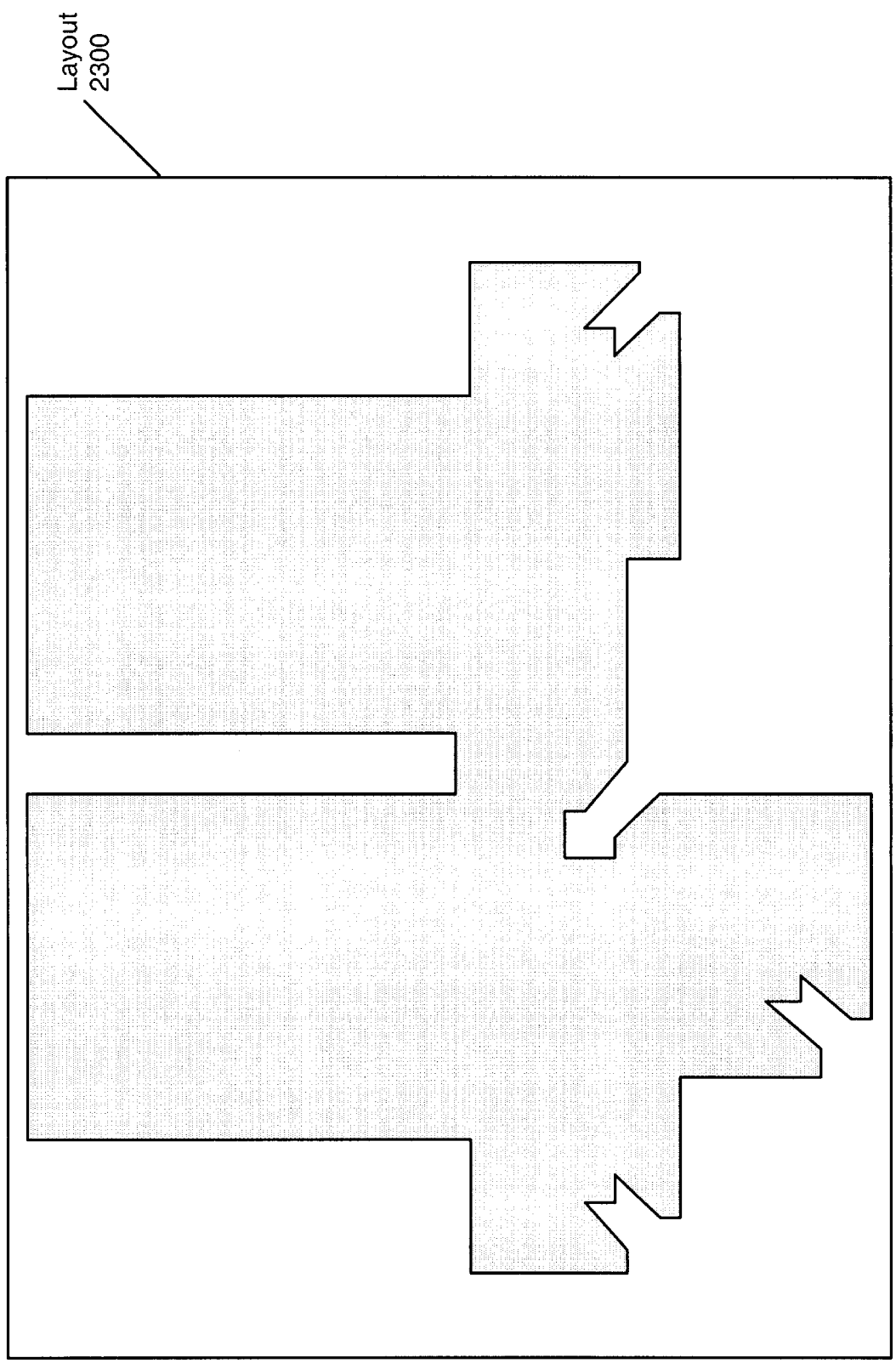
FIG. 23 shows the trim pattern for the layout of FIG. 21.

FIGS. 22 and 23 show the phase shift pattern and the trim pattern respectively after OPC has been performed. More specifically, the layout 2200 in FIG. 22 illustrates the phase shift pattern after OPC and the layout 2300 in FIG. 23 illustrates the trim pattern after OPC.

Figure 24:
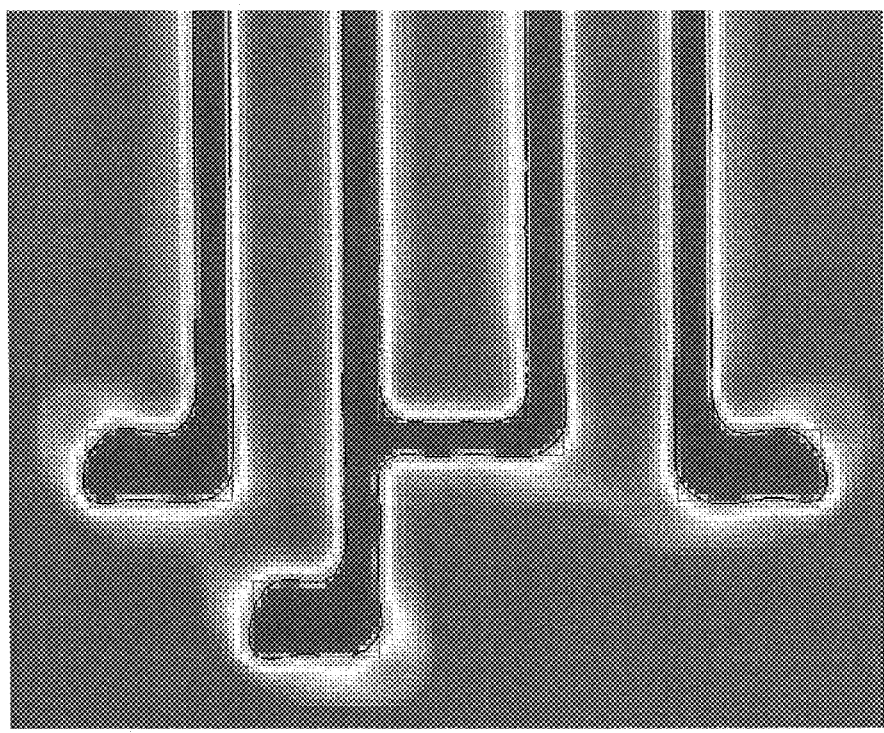
FIG. 24 shows the simulated exposure for the layout of FIG. 21 using the phase and trim patterns of FIGS. 22–23.

Finally, FIG. 24 includes the simulation 2400 of the printed image of the phase layout 2200 used in combination with the trim layout 2300. The target layout is shown as a dark blue/black line.

Reviewing the simulation 2400, it is apparent that the phase conflicts were not an issue because the layout was defined within specification. This can be determined by taking measurements from simulation 2400 and comparing them against requirements, e.g. acceptable CD variance, electrical connectivity, etc. Additionally, it is useful to note that the location of the cut at the corner of the "T" junction is not detectable, due in part to OPC.

Representative Alternative Embodiments

Figure 25:
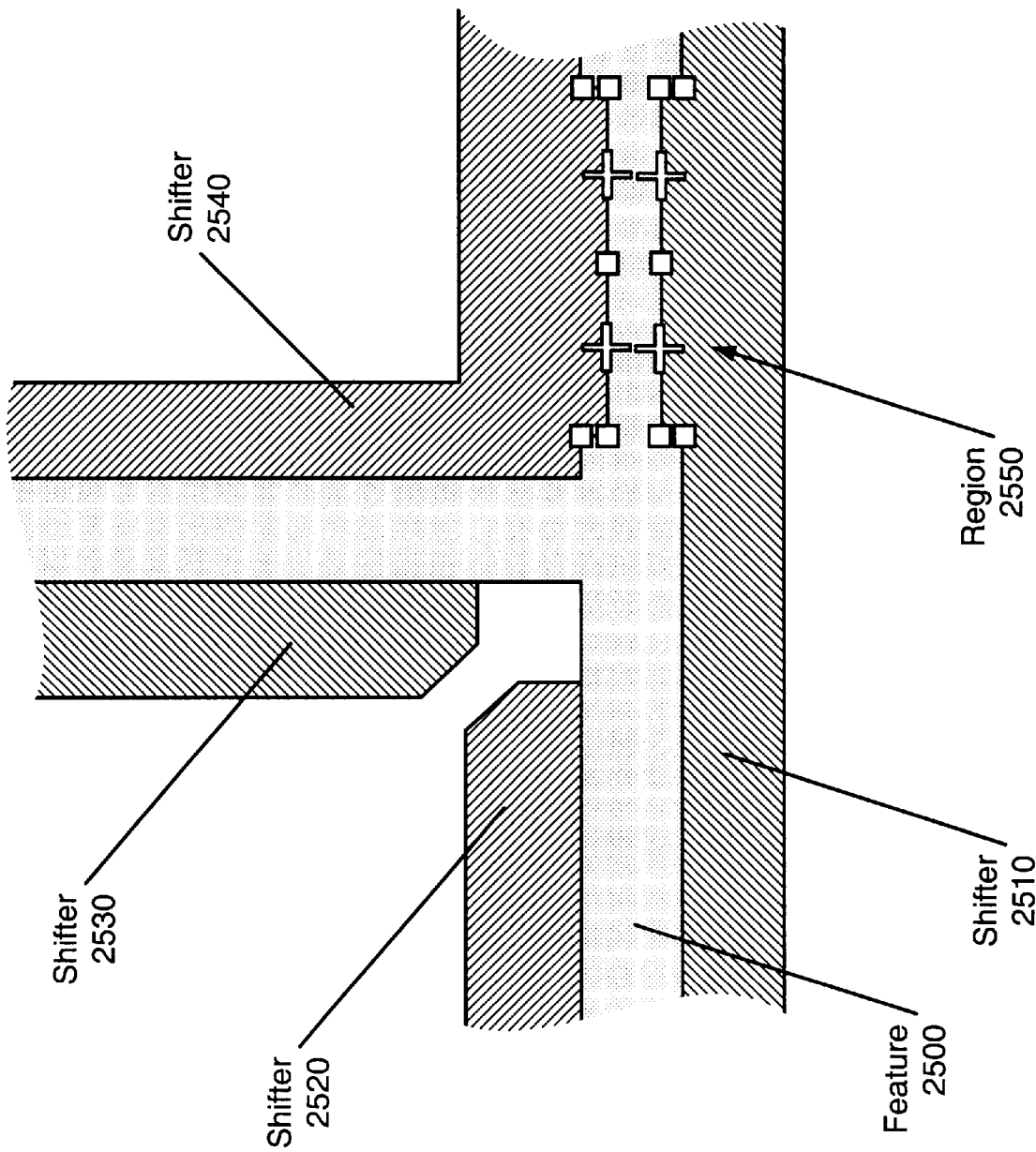
FIG. 25 shows a portion of a layout where critical dimension within a region has been further reduced.

Embodiments of the invention can operate on layouts where portions of the phase shifting layout have been targeted for different critical dimension sizes. For example, FIG. 25 illustrates a portion of a layout where a feature 2500 is defined using phase shifting by a shifter 2510, a shifter 2520, a shifter 2530, and a shifter 2540. Additionally, a region 2550 is indicated where the shifter 2510 and the shifter 2540 have been modified to produce a smaller critical dimension (CD) than is used for the feature 2500. However, the placement of evaluation and dissection points for the phase shift pattern within the region 2550 is the same as described above.

Figure 26:
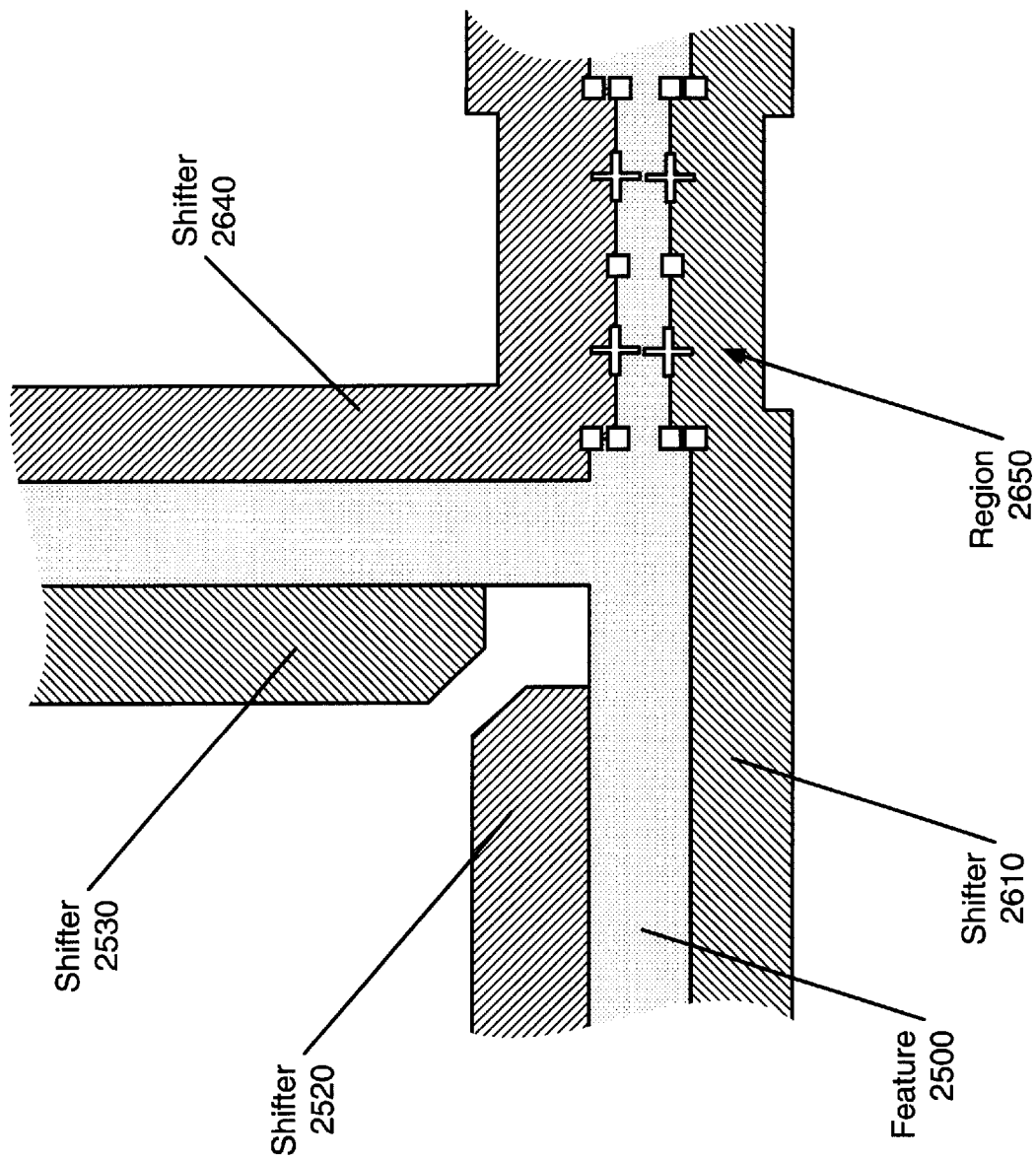
FIG. 26 shows a portion of the layout of FIG. 25 after the shifter widths are further adjusted to produce the reduced critical dimension region.

Furthermore, the shifter widths abutting the region 2550 can be further adjusted to reduce the need for OPC while printing the narrow critical dimension feature in the region 2550. For example, if necessary the outer edges of the shifters could be made wider than the shifters in the surrounding region, not shown. Or conversely, the shifter width in the region 2550 could be made narrower, see FIG. 26. More specifically, FIG. 26 includes the feature 2500 defined by the shifter 2520, the shifter 2530, a shifter 2610 and a shifter 2640. The shifter 2610 and the shifter 2640 are narrower in the region 2650 where reduced critical dimension is desired.

The appropriate sizing, e.g. shifter widths, can depend on the available field as well as other features surrounding the shifters in the region 2550. Also, in some embodiments, a preferred shifter width for reduced critical dimension features may be selected, e.g. $n\lambda$, where $n>0.0$. Then, to the extent practical based on the layout, the shifter widths in regions like the region 2550 are modified so that the intervening control chrome is a narrower size and the widths correspond to the preferred shifter width.

In variants of the above embodiments, the target layout may be reduced at critical areas where reduced feature size is desired prior to application of the phase shifting process. In such an event, the resultant layout will look similar to FIG. 25 and/or FIG. 26.

Additionally, although the description has primarily focused on examples of defining a polysilicon, or "poly", layer within an IC, phase shifting can be used to define other layers of material, e.g. interconnects, metal, etc.

Embodiments of the invention can also operate on cuts shaped other than as described, for example the invention can be applied to cuts where the notch is a simple diagonal opening without the addition of a square head, or base. However, experimental test runs have shown that such layouts frequently, but not always, result in OPC corrections inward towards the target layout for the first segment. For example, returning to FIG. 3, if the shifter 302 met the dissection point 316 from a 45 degree line, then the first OPC segment running to the dissection point 312 would typically be biased in towards the feature 300. This may or may not result in a design rule compliant phase shifter, or trim, shape. Nonetheless, OPC can be performed on such a layout as described above.

In one embodiment, the optical proximity correction (OPC) process for a layout where substantially all of the layout is defined using phase shifting comprises performing OPC of the binary layer for non-critical features and performing OPC of the phase shift pattern for critical features. In each case, OPC is only performed on edges where the respective layer abuts the target layout.

Some embodiments of the invention include computer programs for simulating stepper exposures using masks to compute appropriate relative dosing between phase and trim/binary exposures. In one embodiment, the ICWorkbench(TM) software produced by Numerical Technologies, Inc., San Jose, Calif. is used to simulate the exposure conditions, e.g. as seen in FIG. 10, etc. In other embodiments, computer programs are used to perform optical proximity corrections. In one embodiment, the iN-Phase (TM), iN-Tandem(TM), and/or Photolynx(TM) software programs produced by Numerical Technologies, Inc., are used to perform the optical proximity correction processes. In other embodiments, suitable tools from Avant! and/or Mentor Graphics are used in the optical proximity correction processes. In some embodiments, the computer programs are stored in computer readable media, e.g. CD-ROM, DVD, etc. In other embodiments, the computer programs are embodied in an electromagnetic carrier wave. For example, the electromagnetic carrier wave may include the programs being accessed over a network.

As used herein, the term optical lithography refers processes that include the use of visible, ultraviolet, deep ultraviolet, extreme ultraviolet, x-ray, e-beam, and other radiation sources for lithography purposes.

Conclusion

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

We claim:

1. A method for producing a computer readable definition of a photolithographic mask or masks used to define a target pattern in a layer to be formed using the mask or masks, wherein said pattern includes a target feature; the method comprising:

laying out a first mask pattern including phase shift windows having boundaries defined by line segments in the first mask layout, and a second mask pattern including trim shapes having boundaries defined by line segments in the second mask pattern, wherein in combination the first and second mask patterns are used for defining said target feature of said target pattern, a first phase shift window in the first mask pattern being defined by a plurality of line segments, including at least one line segment abutting the target feature and a second phase shift window in the first mask pattern being defined by a plurality of line segments, including at least one line segment abutting the target feature, and a trim shape including a transmissive region in the second mask pattern being defined by a plurality of line segments, including at least one line segment abutting the target feature, in which a shape caused by a phase transition between said first and second phase shift windows in the first mask pattern is cleared by said transmissive region in said trim shape in the second mask pattern;

adjusting positions of said at least one line segment of said first phase shift window in said first mask pattern, and of said at least one line segment of said trim shape in said second mask layout to provide proximity correction; and storing a result of said laying out and said adjusting in a computer readable medium.

2. The method of claim 1, including defining said at least one line segment in the first mask pattern by dissecting boundaries of said first phase shift window at dissection points selected according to the shape of said first phase shift window, and defining said at least one line segment in the second mask pattern by dissecting boundaries of said trim shape at dissection points selected according to the shape of said trim shape.

3. The method of claim 1, wherein said first mask layout includes a pair of phase shift windows is arranged so that each of the phase shift windows in said pair includes a complementary phase shift window by which a phase transition is produced that results in formation of a least a part of said target feature, and including defining said line segments the first mask pattern by dissecting a boundary of at least one of the phase shift windows in said pair at a dissection point at a corner of the at least one of said phase shift windows which abuts an edge of said target feature, and defining line segments in the second mask pattern by dissecting a boundary of said trim shape at a dissection point at a corner of said trim shape which abuts an edge of said target feature.

4. The method of claim 1, wherein the target pattern comprises a "full phase" design such that the first mask pattern comprises a "full phase" mask pattern.

5. The method of claim 1, wherein the target pattern is exposed on the layer which can be characterized by one or more of the following: at least eighty percent (80%) of the non-memory portions of the pattern are defined by the phase shift pattern; at least eighty percent (80%) of a part of the floorplan in the pattern is defined by the phase shift pattern; at least ninety percent (90%) of the pattern is defined by the phase shift pattern; all of the features in the critical path of the pattern are defined by the phase shift pattern; all features in the pattern except those features that are not phase shifted due to phase conflicts are defined by the phase shift pattern; everything in the pattern except test structures are defined by the phase shift pattern; and everything in the pattern except dummy structures are defined by the phase shift pattern.

6. The method of claim 1, wherein the target pattern can be characterized by having at least ninety-five (95%) of the features of the target pattern defined by the phase shift pattern.

7. The method of claim 1, wherein said second mask layout includes one or more of tricolor shapes, attenuated phase shift windows, and attenuated opacity shapes.

8. An article of manufacture, comprising;

a computer readable storage medium, having stored thereon computer readable instructions for definition of a photolithographic mask or masks that define a target pattern in a layer to be formed using the mask or masks, wherein said pattern includes a target feature; the computer readable instructions comprising routines for laying out a first mask pattern including phase shift windows having boundaries defined by line segments in the first mask layout, and a second mask pattern including trim shapes having boundaries defined by line segments in the second mask pattern, wherein in combination the first and second mask patterns are used for defining said target feature of said target pattern, a first phase shift window in the first mask pattern being defined by a plurality of line segments, including at least one line segment abutting the target feature and a second phase shift window in the first mask pattern being defined by a plurality of line segments, including at least one line segment abutting the target feature, and a trim shape including a transmissive region in the second mask pattern being defined by a plurality of line segments, including at least one line segment abutting the target feature, in which artifact caused by a phase transition between said first and second phase shift windows in the first mask pattern is cleared by said transmissive region in said trim shape in the second mask pattern;

adjusting positions of said at least one line segment of said first phase shift window in said first mask pattern, and of said at least one line segment of said trim shape in said second mask layout to provide proximity correction; and storing a result of said laying out and said adjusting.

9. The article of manufacture of claim 8, wherein the computer readable instructions comprise routines for defining said at least one line segment in the first mask pattern by dissecting boundaries of said first phase shift window at dissection points selected according to the shape of said first phase shift window, and for defining said at least one line segment in the second mask pattern by dissecting boundaries of said trim shape at dissection points selected according to the shape of said trim shape.

10. The article of manufacture of claim 8, wherein said first mask layout includes a pair of phase shift windows is arranged so that each of the phase shift windows in said pair includes a complementary phase shift window by which a phase transition is produced that results in formation of a least a part of said target feature, and wherein the computer readable instructions comprise routines for defining said line segments the first mask pattern by dissecting a boundary of at least one of the phase shift windows in said pair at a dissection point at a corner of the at least one of said phase shift windows which abuts an edge of said target feature, and for defining line segments in the second mask pattern by dissecting a boundary of said trim shape at a dissection point at a corner of said trim shape which abuts an edge of said target feature.

11. The article of manufacture of claim 8, wherein the target pattern comprises a "full phase" design such that the first mask pattern comprises a "full phase" mask pattern.

12. The article of manufacture of claim 8, wherein the target pattern is exposed on the layer which can be characterized by one or more of the following: at least eighty percent (80%) of the non-memory portions of the pattern are defined by the phase shift pattern; at least eighty percent (80%) of a part of the floorplan in the pattern is defined by the phase shift pattern; at least ninety percent (90%) of the pattern is defined by the phase shift pattern; all of the features in the critical path of the pattern are defined by the phase shift pattern; all features in the pattern except those features that are not phase shifted due to phase conflicts are defined by the phase shift pattern; everything in the pattern except test structures are defined by the phase shift pattern; and everything in the pattern except dummy structures are defined by the phase shift pattern.

13. The article of manufacture of claim 8, wherein the target pattern can be characterized by having at least ninety-five (95%) of the features of the target pattern defined by the phase shift pattern.

14. The article of manufacture of claim 8, wherein said second mask layout includes one or more of tricolor shapes, attenuated phase shift windows, and attenuated opacity shapes.

15. A method for manufacturing an integrated circuit having a layer of material having a target pattern, wherein said target pattern includes a target feature, comprising:

laying out a first mask pattern including phase shift windows having boundaries defined by line segments in the first mask layout, and a second mask pattern including trim shapes having boundaries defined by line segments in the second mask pattern, wherein in combination the first and second mask patterns are used for defining said target feature of said target pattern, a first phase shift window in the first mask pattern being defined by a plurality of line segments, including at least one line segment abutting the target feature and a second phase shift window in the first mask pattern being defined by a plurality of line segments, including at least one line segment abutting the target feature, and a trim shape including a transmissive region in the second mask pattern being defined by a plurality of line segments, including at least one line segment abutting the target feature, in which an artifact caused by a phase transition between said first and second phase shift windows in the first mask pattern is cleared by said transmissive region in said trim shape in the second mask pattern;

adjusting positions of said at least one line segment of said first phase shift window in said first mask pattern, and of said at least one line segment of said trim shape in said second mask layout to provide proximity correction;

producing a computer readable definition of said first and second mask patterns;

producing at least one mask using said computer readable definition of said first and second mask layouts; and forming said layer using said at least one mask.

16. The method of claim 15, including defining said at least one line segment in the first mask pattern by dissecting boundaries of said first phase shift window at dissection points selected according to the shape of said first phase shift window, and defining said at least one line segment in the second mask pattern by dissecting boundaries of said trim shape at dissection points selected according to the shape of said trim shape.

17. The method of claim 15, wherein said first mask layout includes a pair of phase shift windows is arranged so that each of the phase shift windows in said pair includes a complementary phase shift window by which a phase transition is produced that results in formation of a least a part of said target feature, and including defining said line segments the first mask pattern by dissecting a boundary of at least one of the phase shift windows in said pair at a dissection point at a corner of the at least one of said phase shift windows which abuts an edge of said target feature, and defining line segments in the second mask pattern by dissecting a boundary of said trim shape at a dissection point at a corner of said trim shape which abuts an edge of said target feature.

18. The method of claim 15, wherein the target pattern comprises a "full phase" design such that the first mask pattern comprises a "full phase" mask pattern.

19. The method of claim 15, wherein the target pattern is exposed on the layer which can be characterized by one or more of the following: at least eighty percent (80%) of the non-memory portions of the pattern are defined by the phase shift pattern; at least eighty percent (80%) of a part of the floorplan in the pattern is defined by the phase shift pattern; at least ninety percent (90%) of the pattern is defined by the phase shift pattern; all of the features in the critical path of the pattern are defined by the phase shift pattern; all features in the pattern except those features that are not phase shifted due to phase conflicts are defined by the phase shift pattern; everything in the pattern except test structures are defined by the phase shift pattern; and everything in the pattern except dummy structures are defined by the phase shift pattern.

20. The method of claim 15, wherein the target pattern can be characterized by having at least ninety-five (95%) of the features of the target pattern defined by the phase shift pattern.

21. The method of claim 15, wherein said second mask layout one or more of tricolor shapes, attenuated phase shift windows, and attenuated opacity shapes.

22. A lithographic mask set including one or more masks for use in manufacturing a layer of material having a target pattern, the target pattern including a target feature, comprising:
   a first mask pattern on a mask in said mask set including phase shift windows having boundaries defined by line segments in the first mask layout, and a second mask pattern including trim shapes having boundaries defined by line segments in the second mask pattern, wherein in combination the first and second mask patterns are used for defining said target feature of said target pattern, a first phase shift window in the first mask pattern being defined by a plurality of line segments, including at least one line segment abutting the target feature and a second phase shift window in the first mask pattern being defined by a plurality of line segments, including at least one line segment abutting the target feature, and a trim shape including a transmissive region in the second mask pattern being defined by a plurality of line segments, including at least one line segment abutting the target feature, in which an artifact caused by a phase transition between said first and second phase shift windows in the first mask pattern is cleared by said transmissive region in said trim shape in the second mask pattern;
   positions of said at least one line segment of said first phase shift window in said first mask pattern, and of said at least one line segment of said trim shape in said second mask layout being offset from adjacent line segments defining said phase shift window and said trim shape, respectively, to provide proximity correction.

23. The mask set of claim 22, wherein said first mask layout includes a pair of phase shift windows arranged so that each of the phase shift windows in said pair includes a complementary phase shift window by which a phase transition is produced that results in formation of a least a part of said target feature, and said at least one line segment in the first mask pattern has an end at a corner of the at least one of said phase shift windows which abuts an edge of said target feature, and said at least one line segment in the second mask pattern has an end at a corner of said trim shape which abuts an edge of said target feature.

24. The mask set of claim 22, wherein the target pattern comprises a "full phase" design such that the first mask pattern comprises a "full phase" mask pattern.

25. The mask set of claim 22, wherein the target pattern is exposed on the layer which can be characterized by one or more of the following: at least eighty percent (80%) of the non-memory portions of the pattern are defined by the phase shift pattern; at least eighty percent (80%) of a part of the floorplan in the pattern is defined by the phase shift pattern; at least ninety percent (90%) of the pattern is defined by the phase shift pattern; all of the features in the critical path of the pattern are defined by the phase shift pattern; all features in the pattern except those features that are not phase shifted due to phase conflicts are defined by the phase shift pattern; everything in the pattern except test structures are defined by the phase shift pattern; and everything in the pattern except dummy structures are defined by the phase shift pattern.

26. The mask set of claim 22, wherein the target pattern can be characterized by having at least ninety-five (95%) of the features of the target pattern defined by the phase shift pattern.

27. The mask set of claim 22, wherein said second mask layout includes one or more of tricolor shapes, attenuated phase shift windows, and attenuated opacity shapes.

28. A method for performing optical proximity correction for a target feature of an integrated circuit layout, using a full phase pattern that comprises first and second phase shift windows having respective sides comprising at least one line segment abutting the target feature, where a phase transition between the first and second phase shift window cause an artifact to be trimmed, and a trim shape comprising at least one line segment abutting the target feature and used to trim said artifact, the method comprising:
   identifying said at least one line segment of the first phase shift window and said at least one line segment of the trim shape that abut said target feature; and
   performing proximity correction to adjust positions of said at least one line segment of said first phase shift window and said at least one line segment of the trim shape.

29. The method of claim 28, wherein said adjusting includes offsetting said at least one line segment of the phase shift window and said at least one line segment of the trim shape from adjacent line segments defining boundaries of said features.

30. The method of claim 28, wherein said adjusting includes offsetting said at least one line segment of the phase shift window and said at least one line segment of the trim shape orthogonally from adjacent line segments defining boundaries of said features.

31. A method for producing a computer readable definition of photolithographic masks that define a target pattern in a layer to be formed using the mask, wherein said pattern includes a target feature; the method comprising:
   laying out a first mask pattern including phase shift windows having boundaries defined by line segments in the first mask layout, and a second mask pattern including trim shapes having boundaries defined by line segments in the second mask pattern, wherein in combination the first and second mask patterns are used for defining said target pattern in which at least a part of an exposure feature caused by a phase transition between a pair of phase shift windows in the first mask pattern is cleared by a transmissive region in a trim shape in the second mask pattern to define a portion of said target feature;

adjusting positions of a line segment defining boundaries of said pair of phase shift windows in said first mask pattern, and of a line segment defining boundaries of said transmissive region in said second mask layout to provide proximity correction for said target feature; and storing a result of said laying out and said adjusting in a computer readable medium.

32. The method of claim 31, wherein said adjusting includes adjusting positions of a line segment defining a portion of a phase shift window in said pair of phase shift windows in the first mask pattern and of a line segment defining a portion of said transmissive region in the second mask pattern.

33. The method of claim 31, including defining said line segments in the first mask pattern by dissecting boundaries of at least one of the phase shift windows in said pair of phase shift windows at dissection points selected according to the shape of said one of the phase shift windows, and defining said line segments in the second mask pattern by dissecting boundaries of said transmissive region and dissection points selected according to the shape of said transmissive region.

34. The method of claim 31, wherein said pair of phase shift windows is arranged so that each of said phase shift windows in said pair includes a complementary phase shift window by which a phase transition is produced that results in formation of a least a part of said target feature in the layer, and including defining said line segments the first mask pattern by dissecting a boundary of at least one of the phase shift windows in said pair at a dissection point at a corner of the one phase shift window which abuts an edge of said target feature, and defining line segments in the second mask pattern by dissecting a boundary of said transmissive region at a dissection point at a corner of said transmissive region which abuts an edge of said target feature.

35. The method of claim 31, wherein said line segments defining boundaries of said first and second phase shift windows and of said transmissive region have end points at dissection points abutting edges of said target feature selected according to design rules including as arguments the shapes of the first and second phase shift windows and of said transmissive region.

36. The method of claim 35, wherein said line segments include a first line segment defining a boundary of a first phase shift window in said pair of phase shift windows, and having an end point at a dissection point located where an end of the first phase shift window abuts an edge of said target feature, and a second line segment defining a boundary of said transmissive region having an end point at a dissection point located where a side of the said transmissive region abuts said edge.

37. The method of claim 36, wherein said end point of said first line segment and said end point of said second line segment overlay substantially the same position on said target feature.

38. The method of claim 36, wherein said end point of said first line segment and said end point of said second line segment are positioned at different locations on said target feature.

39. The method of claim 31, wherein the target pattern comprises a "full phase" design such that the first mask pattern comprises a "full phase" mask pattern.

40. The method of claim 31, wherein the target pattern is exposed on the layer which can be characterized by one or more of the following: at least eighty percent (80%) of the non-memory portions of the pattern are defined by the phase shift pattern; at least eighty percent (80%) of a part of the floorplan in the pattern is defined by the phase shift pattern; at least ninety percent (90%) of the pattern is defined by the phase shift pattern; all of the features in the critical path of the pattern are defined by the phase shift pattern; all features in the pattern except those features that are not phase shifted due to phase conflicts are defined by the phase shift pattern; everything in the pattern except test structures are defined by the phase shift pattern; and everything in the pattern except dummy structures are defined by the phase shift pattern.

41. The method of claim 31, wherein the target pattern can be characterized by having at least ninety-five (95%) of the features of the target pattern defined by the phase shift pattern.

42. A method for producing a computer readable definition of photolithographic masks that define a target pattern in a layer to be formed using the mask, wherein said pattern includes a target feature having an inside corner formed by an intersection of first and second edges of the target feature; the method comprising:

laying out a first mask pattern including phase shift windows having boundaries defined by line segments in the first mask layout, and a second mask pattern including trim shapes having boundaries defined by line segments in the second mask pattern, wherein the first and second mask patterns are used in combination for defining the inside corner of the target feature, the first mask pattern including first and second phase shift windows having an opposite phases and abutting the first and second edges of the feature near the inside corner so that a phase transition occurs between the first and second phase shift windows in a location near the inside corner, and a second mask pattern including a trim shape having a transmissive region corresponding to the location of the phase for clearing at least a portion of the exposure feature caused by the phase transition;

adjusting positions of line segments defining boundaries of said first and second phase shift windows in said first mask pattern, and of line segments defining boundaries of said trim shape in said second mask layout to provide proximity correction; and storing a result of said laying out and said adjusting in a computer readable medium.

43. The method of claim 42, wherein said line segments defining boundaries of said first and second phase shift windows and of said transmissive region have end points near said inside corner at dissection points abutting said first and second edges selected according to design rules including as arguments the shapes of the first and second phase shift windows and of said transmissive region.

44. The method of claim 42, wherein said line segments include a first line segment defining a boundary of said first phase shift window having an end point at a dissection point located where an end of the first phase shift window adjacent said inside corner abuts said first edge, and a second line segment defining a boundary of said transmissive region having an end point at a dissection point located where a side of the said transmissive region abuts said first edge.

45. The method of claim 44, wherein said end point of said first line segment and said end point of said second line segment overly substantially the same position on said target feature.

46. The method of claim 44, wherein said end point of said first line segment and said end point of said second line segment are positioned at different locations on said target feature.

47. A method for producing a computer readable definition of photolithographic masks that define a target pattern in a layer to be formed using the mask, wherein said pattern includes a target feature having an outside corner formed by an intersection of first and second edges of the target feature; the method comprising:

laying out a first mask pattern including phase shift windows having boundaries defined by line segments in the first mask layout, and a second mask pattern including trim shapes having boundaries defined by line segments in the second mask pattern, wherein the first and second mask patterns are used in combination for defining the outside corner of the target feature, the first mask pattern including first and second phase shift windows having an opposite phases and abutting the first and second edges of the feature near the outside corner so that a phase transition occurs between the first and second phase shift windows in a location near the outside corner, and a second mask pattern including a trim shape having a transmissive region corresponding to the location of the phase for clearing at least a portion of the exposure feature caused by the phase transition;

adjusting positions of line segments defining boundaries of said first and second phase shift windows in said first mask pattern, and of line segments defining boundaries of said trim shape in said second mask layout to provide proximity correction; and storing a result of said laying out and said adjusting in a computer readable medium.

48. The method of claim 47, wherein said line segments defining boundaries of said first and second phase shift windows and of said transmissive region have end points near said inside corner at dissection points abutting said first and second edges selected according to design rules including as arguments the shapes of the first and second phase shift windows and of said transmissive region.

49. The method of claim 47, wherein said line segments include a first line segment defining a boundary of said first phase shift window having an end point at a dissection point located where an end of the first phase shift window adjacent said inside corner abuts said first edge, and a second line segment defining a boundary of said transmissive region having an end point at a dissection point located where a side of the said transmissive region abuts said first edge.

50. The method of claim 49, wherein said end point of said first line segment and said end point of said second line segment overly substantially the same position on said target feature.

51. The method of claim 49, wherein said end point of said first line segment and said end point of said second line segment are positioned at different locations on said target feature.

52. A method for producing a computer readable definition of photolithographic masks that define a target pattern in a layer to be formed using the mask, wherein said pattern includes a target feature having first and second outside corners formed by intersection of first, second and third edges of the target feature; the method comprising:

laying out a first mask pattern including phase shift windows having boundaries defined by line segments in the first mask layout, and a second mask pattern including trim shapes having boundaries defined by line segments in the second mask pattern, wherein the first and second mask patterns are used in combination for defining the first and second outside corners of the target feature, the first mask pattern including first and second phase shift windows having an opposite phases and abutting the first and second edges of the feature near the first outside corner and a third phase shift window having the same phase as the first phase shift window and abutting the third edge of the feature near the second outside corner, so that a first phase transition occurs between the first and second phase shift windows in a location near the first outside corner which causes an exposures feature tending to extend a line away from said first outside corner, and a second phase transition occurs between the second and third phase shift windows in a location near the second outside corner which causes an exposure feature tending to extend a line away from said second outside corner, and a second mask pattern including a trim shape having a first transmissive region corresponding to the location of the first phase transition for clearing at least a portion of the exposure feature caused by the first phase transition such that said first outside corner is sharper in a resulting image, and having a second transmissive region corresponding to the location of the second phase transition for clearing at least a portion of the exposure feature caused by the second phase transition such that said second outside corner is sharper in the resulting image;

providing proximity correction adjustments to one or both of the first and second mask patterns; and storing a result of said laying out and said adjusting in a computer readable medium.

53. The method of claim 52, wherein said providing proximity correction includes adjusting positions of one or more of the line segments defining boundaries of said first, second and third phase shift windows in said first mask pattern, and of one or more of the line segments defining boundaries of said first and second transmissive region in the trim shape in said second mask layout.

* * * * *